(12) United States Patent
Lee et al.

(10) Patent No.: US 11,848,287 B2
(45) Date of Patent: Dec. 19, 2023

(54) SEMICONDUCTOR DEVICE AND METHOD FOR FABRICATING THEREOF

(71) Applicant: Samsung Electronics Co., Ltd., Suwon-si (KR)

(72) Inventors: Jin-su Lee, Hwaseong-si (KR); Hong Sik Chae, Hwaseong-si (KR); Youn Soo Kim, Yongin-si (KR); Tae Kyun Kim, Suwon-si (KR); Youn Joung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 17/470,370

(22) Filed: Sep. 9, 2021

(65) Prior Publication Data

US 2022/0093532 A1 Mar. 24, 2022

(30) Foreign Application Priority Data

Sep. 23, 2020 (KR) ........................ 10-2020-0122727

(51) Int. Cl.
| | |
|---|---|
| *H01L 23/64* | (2006.01) |
| *H01L 27/108* | (2006.01) |
| *H10B 12/00* | (2023.01) |

(52) U.S. Cl.
CPC ........... *H01L 23/642* (2013.01); *H10B 12/30* (2023.02)

(58) Field of Classification Search
CPC .............................. H01L 23/642; H10B 12/30
See application file for complete search history.

(56) References Cited

U.S. PATENT DOCUMENTS

| | | | |
|---|---|---|---|
| 6,524,952 | B1 | 2/2003 | Srinivas et al. |
| 7,476,614 | B2 | 1/2009 | Kwak et al. |
| 9,076,864 | B2 | 7/2015 | Lee et al. |
| 9,385,135 | B2 | 7/2016 | Whang et al. |
| 9,576,904 | B2 | 2/2017 | Sandhu et al. |

(Continued)

FOREIGN PATENT DOCUMENTS

| | | |
|---|---|---|
| KR | 101958381 B1 | 3/2019 |
| TW | 201919153 A | 5/2019 |

(Continued)

OTHER PUBLICATIONS

Office Action dated Nov. 22, 2022 in Taiwanese Application No. 110131681.

*Primary Examiner* — Peniel M Gumedzoe

(74) *Attorney, Agent, or Firm* — HARNESS, DICKEY & PIERCE, P.L.C.

(57) ABSTRACT

Provided a semiconductor device comprises, a plurality of semiconductor patterns spaced in a first direction; a plurality of mold insulating layers between the plurality of semiconductor patterns, a plurality of silicide patterns contacting the plurality of semiconductor patterns; and a plurality of first metal conductive films between the plurality of mold insulating layers and connected to each of the silicide patterns, wherein each of the silicide patterns includes a first sidewall that faces the semiconductor pattern, and a second sidewall which faces the first metal conductive film, the first sidewall of the silicide pattern and the second sidewall of the silicide pattern extends in the first direction, and the first sidewall of the silicide pattern and the second sidewall of the silicide pattern are curved surfaces.

20 Claims, 34 Drawing Sheets

(56) References Cited

U.S. PATENT DOCUMENTS

| | | | |
|---|---|---|---|
| 9,981,286 B2 | 5/2018 | Woodruff et al. | |
| 2009/0173981 A1* | 7/2009 | Nitta | H10B 43/30 |
| | | | 257/302 |
| 2016/0079257 A1* | 3/2016 | Sonehara | H01L 21/32105 |
| | | | 438/591 |

FOREIGN PATENT DOCUMENTS

| | | |
|---|---|---|
| TW | 202010054 A | 3/2020 |
| TW | 202029349 A | 8/2020 |
| TW | 202032665 A | 9/2020 |

* cited by examiner

SEMICONDUCTOR DEVICE AND METHOD FOR FABRICATING THEREOF

CROSS-REFERENCE TO RELATED APPLICATION

This application claims priority from Korean Patent Application No. 10-2020-0122727 filed on Sep. 23, 2020 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a semiconductor device and a method for fabricating the same, and more specifically, to a semiconductor device including semiconductor patterns stacked in a direction perpendicular to a substrate and a method for fabricating the same.

2. Explanation of the Related Art

In order to satisfy excellent performance and low price required by consumers, it is beneficial to increase the degree of integration of semiconductor elements. In the case of semiconductor elements, because the degree of integration is an important factor for determining the price of a product, an increased density is particularly required.

In the case of a conventional two-dimensional or planar semiconductor element, the degree of integration is largely determined by, for example, the density of elements in an area occupied by a unit memory cell, and the degree of integration is, therefore, greatly affected by the level of fine pattern forming technology. However, since ultra-expensive apparatuses are required for further miniaturization of patterns, the degree of integration of two-dimensional semiconductor elements is increasing, but it is still limited. Accordingly, semiconductor elements including semiconductor patterns arranged three-dimensionally have been proposed.

SUMMARY

Provide are some example embodiments of a semiconductor device having improved performance and reliability of element.

Aspects of the example embodiments also provide a method for fabricating a semiconductor device having improved performance and reliability of element.

However, aspects of the example embodiments are not restricted to the one set forth herein. These and other example embodiments will become more apparent to one of ordinary skill in the art to which the present disclosure pertains by referencing the detailed explanation given below.

According to an aspect of the present disclosure, there is provided a semiconductor device comprising a plurality of semiconductor patterns spaced apart in a first direction; a plurality of mold insulating layers between the plurality of semiconductor patterns; a plurality of silicide patterns contacting the plurality of semiconductor patterns; and a plurality of first metal conductive films between the plurality of mold insulating layers and contacting the plurality of silicide patterns, wherein each of the silicide patterns includes a first sidewall facing a semiconductor of the plurality of semiconductor patterns, and a second sidewall facing a first metal conductive film of the plurality of first metal conductive films, the first sidewall of the silicide pattern and the second sidewall of the silicide pattern extends in the first direction, and the first sidewall of the silicide pattern and the second sidewall of the silicide pattern are curved surfaces.

According to another aspect of the present disclosure, there is provided a semiconductor device comprising a plurality of semiconductor patterns spaced apart in a first direction; a plurality of mold insulating layers between the plurality of semiconductor patterns; a plurality of silicide patterns contacting the plurality of semiconductor patterns; a plurality of side extension holes defined by the plurality of silicide patterns and adjacent mold insulating layers, of the plurality of mold insulating layers that are adjacent to each other in the first direction, and the plurality of side extension holes extending in a second direction perpendicular to the first direction; and a plurality of first metal conductive films in the plurality of side extension holes and connected to the plurality of silicide patterns, wherein each of the silicide patterns includes a first sidewall facing a semiconductor pattern of the plurality of semiconductor patterns, and a second sidewall facing a first metal conductive film of the plurality of first metal conductive films, each of the side extension hole includes an upper face and a lower face defined by the adjacent mold insulating layers, and a sidewall defined by the second sidewall of the silicide pattern, in each of the extension holes on the side surface, a ratio of a width of the side extension hole in the second direction to a height of the side extension hole in the first direction is 5 or more and the widths of each of the silicide patterns in the second direction are the corresponding heights.

According to another aspect of the present disclosure, there is provided a semiconductor device comprising, a plurality of mold insulating layers spaced apart in a first direction; a plurality of semiconductor patterns between the plurality of mold insulating layers; a plurality of gate electrodes on the plurality of semiconductor patterns, the plurality of gates extending in a second direction perpendicular to the first direction; a bit line extending in the first direction and connected to the plurality of semiconductor patterns; a plurality of silicide patterns contacting the plurality semiconductor patterns; a plurality of side extension holes defined by the plurality of silicide pattern and adjacent mold insulating layers of the plurality of the mold insulating layers, the plurality of side extension holes extending in a third direction perpendicular to the first direction and the second direction; and a plurality of capacitors in the plurality of side extension holes and connected to the plurality of silicide patterns, wherein each side extension hole includes an upper face and a lower face defined by the adjacent mold insulating layers, and a sidewall defined by a silicide pattern of the plurality of silicide patterns, each of the silicide patterns does not extend along the upper face of the side extension hole and the lower face of the side extension hole, and widths of each of the silicide patterns in the third direction are the same corresponding heights.

According to another aspect of the present disclosure, there is provided a method for fabricating a semiconductor device, the method comprising forming a mold structure by alternately stacking mold insulating layers and semiconductor patterns in a first direction, the mold structure including a plurality of pre side extension holes defined by the semiconductor pattern and adjacent mold insulating layers, the plurality of pre side extension holes extending in a second direction perpendicular to the first direction; forming a seed metal film along profiles of each of the pre side extension hole using a reductant having a group IVA or a group IVB element as a central atom; forming a plurality of silicide patterns between the mold insulating layers through a silicidizing process of the seed metal film and the semiconductor pattern, and forming a metal conductive film in a remainder of the pre side extension holes, the metal conductive film connected to the silicide pattern.

BRIEF EXPLANATION OF THE DRAWINGS

The and other example embodiments will become more apparent by describing in detail example embodiments thereof referring to the attached drawings, in which.

DETAILED EXPLANATION OF THE EMBODIMENTS

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," and/or "under," other elements or features would then be oriented "above" the other elements or features. Thus, the example terms "below" and "under" may encompass both an orientation of above and below.

Figure 1:
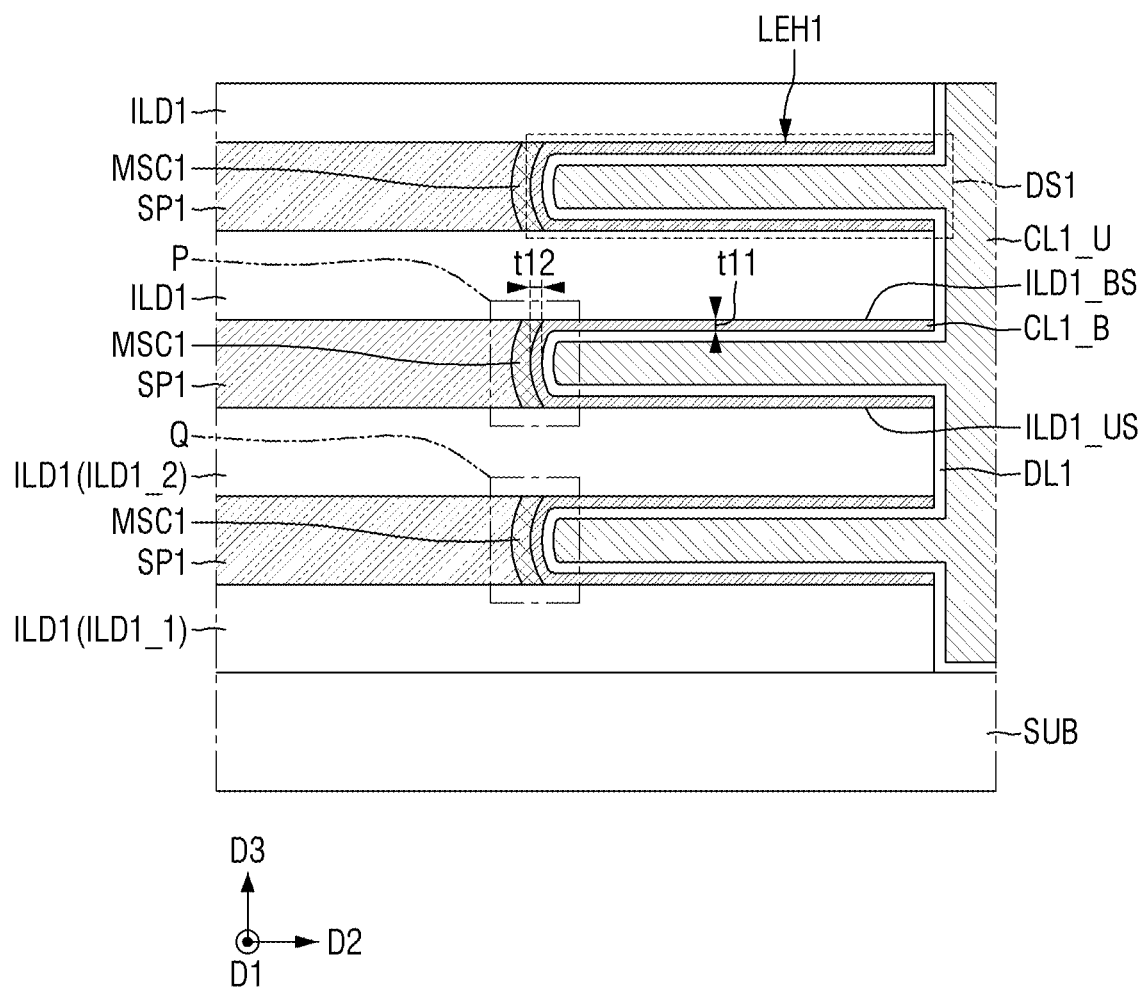
FIG. 1 is a diagram for explaining a semiconductor device according to some embodiments.
Figure 2:
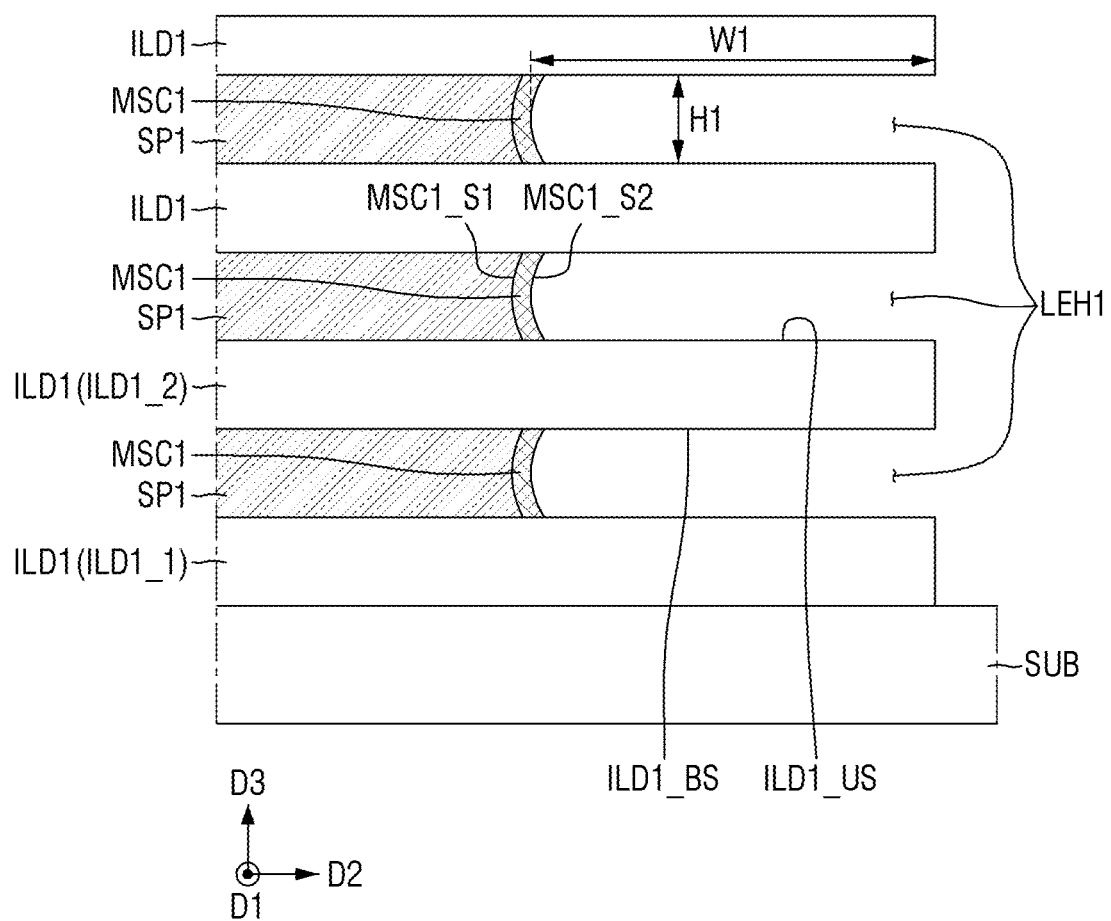
FIG. 2 is a diagram for explaining a semiconductor device except for a first information storage element DS1 in FIG. 1.
Figure 3:
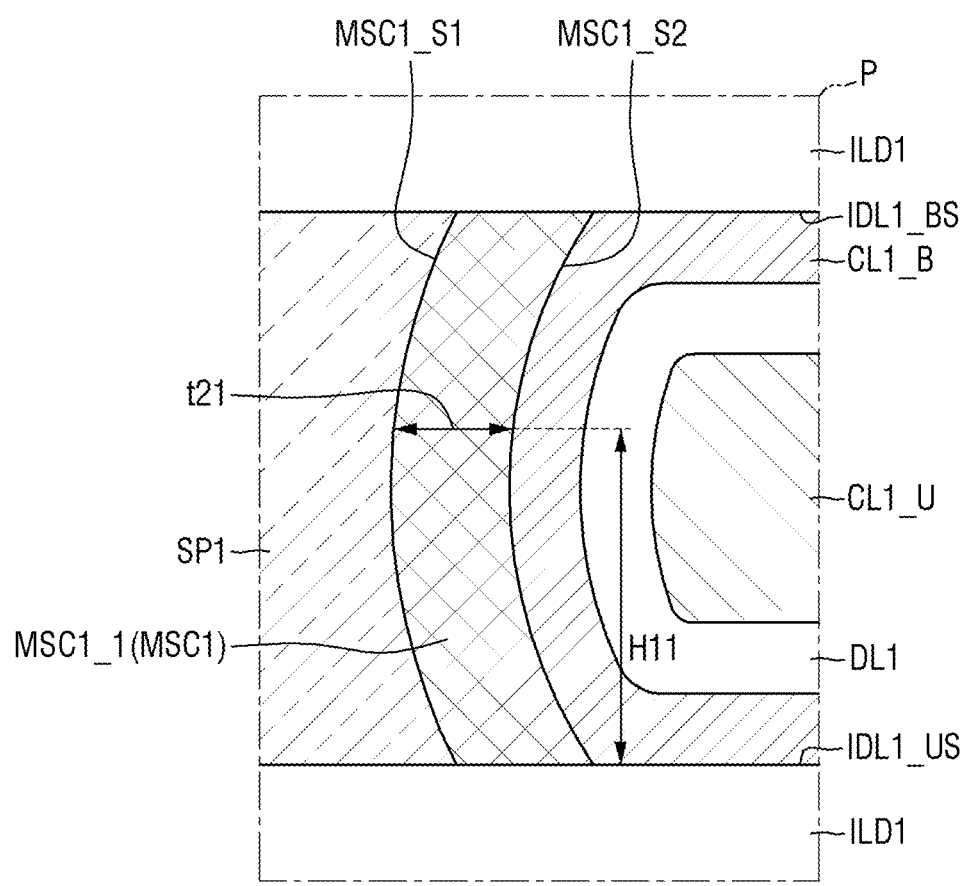
FIGS. 3 and 4 are enlarged views of portions P and Q of FIG. 1.
Figure 4:
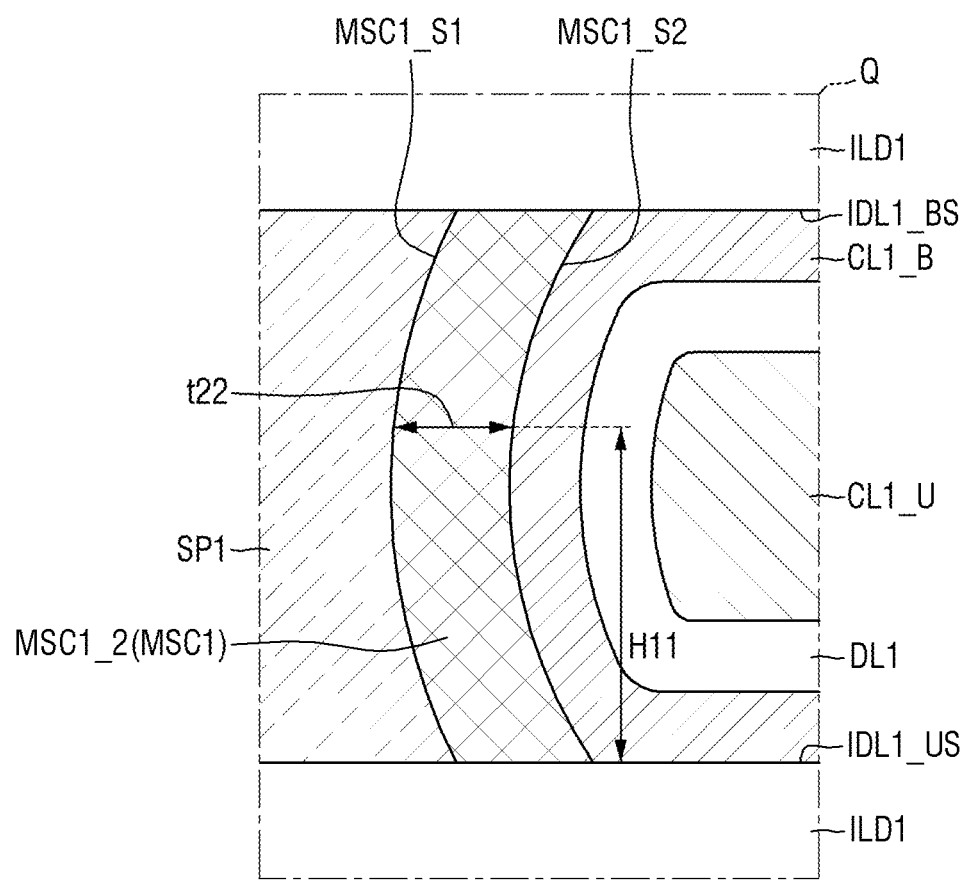

FIG. 1 is a diagram for explaining a semiconductor device according to some embodiments. FIG. 2 is a diagram shown except for a first information storage element DS1 in FIG. 1. FIGS. 3 and 4 are enlarged views of portions P and Q of FIG. 1.

Referring to FIGS. 1 to 4, the semiconductor device according to some embodiments may include a plurality of first semiconductor patterns SP1, a plurality of first mold insulating layers ILD1, a plurality of first silicide patterns MSC1, and a plurality of first information storage elements DS1.

The plurality of first mold insulating layers ILD1 may be placed on a substrate SUB. Each first mold insulating layer ILD1 may be spaced apart from each other in a third direction D3. The third direction D3 may be a thickness direction of the substrate SUB. Although four first mold insulating layers ILD1 are shown, this is only for convenience of explanation, and the embodiment is not limited thereto. For example, the semiconductor device may include more or fewer first mold insulating layers ILD1 than shown.

Each first mold insulating layer ILD1 may include an upper face ILD1_US and a lower face ILD1_BS which are opposite to each other in the third direction D3. A plurality of first mold insulating layers ILD1 may include a first_1 mold insulating layer ILD1_1 and a first_2 mold insulating layer ILD1_2 that are adjacent to each other in the third direction D3. The first_1 mold insulating layer ILD1_1 may be closer to the substrate SUB than the first_2 mold insulating layer ILD1_2. The upper face ILD1_US of the first_1 mold insulating layer may face the lower face ILD1_BS of the first_2 mold insulating layer.

The first mold insulating layer ILD1 may include an insulating material. The first mold insulating layer ILD1 may include, for example, at least one of a silicon oxide film, a silicon nitride film, a silicon oxide nitride film, a carbon-containing silicon oxide film, a carbon-containing silicon nitride film, and/or a carbon-containing silicon oxide nitride film. As an example, the first mold insulating layer ILD1 may include a silicon oxide film.

The substrate SUB may include a semiconductor (e.g., an elemental and/or compound semiconductor). For example, in the case wherein the substrate SUB includes silicon, the substrate SUB may be bulk silicon or SOI (silicon-on-insulator). In some embodiments, the substrate SUB may be a silicon substrate, and/or may include, but is not limited to, other materials such as silicon germanium, SGOI (silicon germanium on insulator), indium antimonide, lead tellurium compounds, indium arsenide, indium phosphide, gallium arsenide, and/or gallium antimonide. In the following explanation, the substrate SUB will be explained as a silicon substrate.

Although the first mold insulating layer ILD1 located at the lowest part is shown as being in contact with the substrate SUB, the embodiment is not limited thereto. For example, an etching stop film including an insulating material different from the first mold insulating layer ILD1 may be further placed between the first mold insulating layer ILD1 and the substrate SUB.

The plurality of first semiconductor patterns SP1 may be placed between the first mold insulating layers ILD1 adjacent to each other in the third direction D3. Each first semiconductor pattern SP1 may be placed to be spaced apart from each other in the third direction D3.

For example, the plurality of first semiconductor patterns SP1 may be placed on the substrate SUB to be spaced part in the third direction D3. The first mold insulating layer ILD1 may be placed between the first semiconductor patterns SP1 adjacent to each other in the third direction D3. Although the first semiconductor pattern SP1 is illustrated as not between the substrate SUB and the first mold insulating layer ILD1 located at the lowest part, this is only for convenience of explanation, and the embodiment is not limited thereto.

Each first semiconductor pattern SP1 may extend in a second direction D2. The second direction D2 may be a direction perpendicular to the third direction D3. The second direction D2 may be aligned with (e.g., parallel to) the upper face of the substrate SUB. The second direction D2 and the third direction D3 may be perpendicular to a first direction D1.

Each first semiconductor pattern SP1 may overlap a part of the upper face ILD1_US of the first mold insulating layer and a part of the lower face ILD1_BS of the first mold insulating layer, which face each other, in the third direction D3.

The first semiconductor pattern SP1 may include, for example, a semiconductor material such as silicon or silicon-germanium. The semiconductor material may include an elemental and/or a compound semiconductor. For example, in the case wherein the first semiconductor pattern SP1 includes silicon, the first semiconductor pattern SP1 may include at least one of polysilicon, polysilicon germanium, single crystal silicon, and/or single crystal silicon-germanium. In some example embodiments, the first semiconductor pattern SP1 may include a semiconductor material doped with p-type impurities. In some example embodiments, the first semiconductor pattern SP1 may include a semiconductor material doped with n-type impurities. In some example embodiments, the first semiconductor pattern SP1 may include an undoped semiconductor material. Here, the term "undoped semiconductor material" means a semiconductor material that does not include artificially doped p-type or n-type impurities. For example, an undoped semiconductor may include an intrinsic compound semiconductor without doped p-type or n-type impurities.

A plurality of first silicide patterns MSC1 may be placed between the first mold insulating layers ILD1 adjacent to each other in the third direction D3. For example, each first silicide pattern MSC1 may be formed on each first semiconductor pattern SP1. The first silicide pattern MSC1 may contact the first semiconductor pattern SP1.

The first silicide pattern MSC1 may be formed on the first semiconductor pattern SP1 between the adjacent first mold insulating layers ILD1. In some example embodiments, the first silicide pattern MSC1 may contact, but does not extend along the upper face ILD1_US of the first mold insulating layer and the lower face ILD1_BS of the first mold insulating layer which face each other. Alternatively, in a space between the adjacent first mold insulating layers ILD1, the first silicide pattern MSC1 may be formed only on the first semiconductor pattern SP1.

Each first silicide pattern MSC1 may include a first sidewall MSC_S1 and a second sidewall MSC1_S2 extending in the third direction D3. The first sidewall MSC1_S1 of the first silicide pattern faces the first semiconductor pattern SP1. For example, a contact surface between the first silicide pattern MSC1 and the first semiconductor pattern SP1 may be the first sidewall MSC1_S1 of the first silicide pattern. The second sidewall MSC1_S2 of the first silicide pattern faces a first lower conductive film CL1_B of the first information storage element DS1.

The first sidewall MSC1_S1 of the first silicide pattern and the second sidewall MSC1_S2 of the first silicide pattern may include curved surfaces, respectively. For example, the first sidewall MSC_S1 of each first silicide pattern and the second sidewall MSC1_S2 of the first silicide pattern may include curved surfaces that are convex toward the first semiconductor pattern SP1.

In FIGS. 1, 3 and 4, the plurality of first silicide patterns MSC1 may include a first_1 silicide pattern MSC1_1 and a first_2 silicide pattern MSC1_2 placed on the substrate SUB at different heights from each other. Each of the first first_1 silicide pattern MSC1_1 and the first_2 silicide pattern MSC1_2 includes a first sidewall MSC1_S1 and a second sidewall MSC1_S2 that are convex toward the first semiconductor pattern SP1.

At points corresponding to each other, the widths of the first silicide patterns MSC1 placed at different heights from the substrate SUB in the second direction D2 may be the same. For example, a first point spaced at a height H11 from the upper face ILD1_US of the first mold insulating layer located below the first_1 silicide pattern MSC1_1 and a second point spaced at a height H11 from the upper face ILD1_US of the mold insulating layer located below the first_2 silicide pattern MSC1_2 may be points that correspond to each other.

A width t21 of the first_1 silicide pattern MSC1_1 in the second direction D2 at the first point of the first_1 silicide pattern MSC1_1 may be the same as a width t22 of the first_2 silicide pattern MSC1_2 in the second direction D2 at the second point of the first_2 silicide pattern MSC1_2. In some embodiments, when an amount of change in the width of the first silicide pattern MSC1 in the second direction D2 is 50% or less, the widths of the first silicide pattern MSC1 in the second direction D2 at the points corresponding to each other may be considered to be the same. For example, at the points corresponding to each other of the plurality of first silicide patterns MSC1 placed in the third direction D3, the width of the first_1 silicide pattern MSC1_1 in the second direction D2 may have a maximum value, and the width of the first_2 silicide pattern MSC1_2 in the second direction D2 may have a minimum value. At this time, a ratio of the width (e.g., the minimum value) of the first_2 silicide pattern MSC1_2 in the second direction D2 to the width (e.g., maximum value) of the first_1 silicide pattern MSC1_1 in the second direction D2 may be greater than or equal to 0.5.

In the semiconductor device according to some embodiments, the widths t21 and t22 of each first silicide pattern MSC1 in the second direction D2 may be constant as it goes away from the substrate SUB.

In FIG. 3, the width t21 of the first_1 silicide pattern MSC1_1 in the second direction D2 may be constant, as it goes away from the upper face ILD1_US of the first mold insulating layer located below the first_1 silicide pattern MSC1_1.

In FIG. 4, the width t22 of the first_2 silicide pattern MSC1_2 in the second direction D2 may be constant, as it goes away from the upper face ILD1_US of the first mold insulating layer located below the first_2 silicide pattern MSC1_2.

The first silicide pattern MSC1 may include a silicidation material of metal (metal-silicon compound) or a silicidation material of metal nitride (metal nitride-silicon compound). The first silicide pattern MSC1 may include, for example, but is not limited to, at least one of silicidation material of titanium (Ti), niobium (Nb), molybdenum (Mo), tungsten (W), and/or cobalt (Co).

Figure 30:
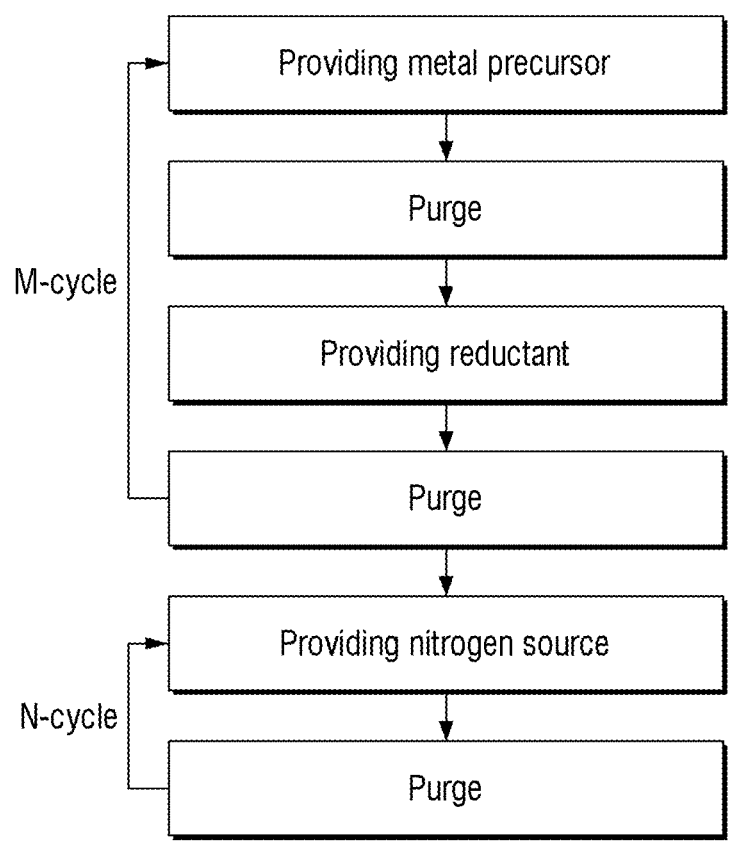
FIGS. 30 and 31 are flowcharts for explaining a method for fabricating the semiconductor device according to some embodiments.
Figure 31:
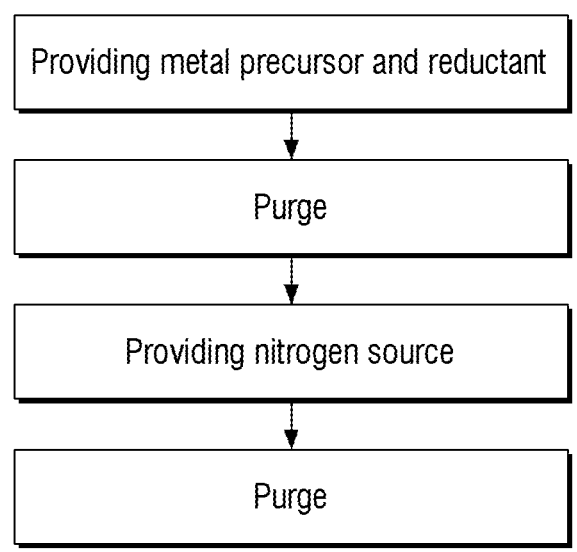

In some embodiments, the first silicide pattern MSC1 may include group IVA or group IVB elements located at a center of a reductant to be explained in FIGS. 30 and 31. However, this is merely an example embodiment, and in some another examples, the first silicide pattern MSC1 does not include group IVA or group IVB elements located at the center of the reductant explained in FIGS. 30 and 31.

A plurality of first side extension holes LEH1 may be defined between the first mold insulating layers ILD1 adjacent to each other in the third direction D3. Each first side extension hole LEH1 may extend in the second direction D2. The first side extension hole LEH1 may extend from the first silicide pattern MSC1 to the end of the first mold insulating layer ILD1.

For example, each first side extension hole LEH1 may be defined by the first silicide pattern MSC1 between the first mold insulation layer ILD1 and the first mold insulation layers ILD1 adjacent to each other.

The upper face of the first side extension hole LEH1 and the lower face of the first side extension hole LEH1 may be defined by the first mold insulating layers ILD1 adjacent to each other in the third direction D3. For example, the upper face of the first side extension hole LEH1 may be defined by the lower face ILD1_BS of the first mold insulating layer, and the lower face of the first side extension hole LEH1 may be defined by the upper face ILD1_US of the first mold insulating layer. The sidewall of the first side extension hole LEH1 may be defined by the second sidewall MSC1_S2 of the first silicide pattern.

The first silicide pattern MSC1 does not extend along the upper face of the first side extension hole LEH1 and the lower face of the first side extension hole LEH1.

In the semiconductor device according to some embodiments, in each first side extension hole LEH1, the ratio of the width W1 of the first side extension hole LEH1 in the second direction D2 (e.g., the width between an end of an adjacent first mold insulating layer ILD1 and a farthest point on the second sidewall MSCI-S2) to the height H1 of the first side extension hole LEH1 in the third direction D3 may be 5 or more.

A plurality of first information storage elements DS1 may be placed in each first side extension holes LEH1. Each first information storage element DS1 may contact the first silicide pattern MSC1.

The first information storage element DS1 may be memory elements capable of storing data. For example, each first information storage element DS1 may be a memory element using a capacitor, a memory element using a magnetic tunnel junction pattern, and/or a memory element using a variable resistor including a phase change material. As an example, each first information storage element DS1 may be a capacitor.

The plurality of first information storage elements DS1 may include a first capacitor dielectric film DL1, a first upper conductive film CL1_U, and a plurality of first lower conductive films CL1_B. Each first information storage element DS1 may include a first lower conductive film CL1_B, a first capacitor dielectric film DL1, and a first upper conductive film CL1_U which are placed in each first side extension hole LEH1. The first information storage element DS1 in each first side extension hole LEH1 may be connected by a part of the first upper conductive film CL1_U placed outside the first side extension hole LEH1.

Each first lower conductive film CL1_B may be placed between the first mold insulating layers ILD1 adjacent to each other in the third direction D3. The first lower conductive film CL1_B may be connected to the first silicide pattern MSC1. The first lower conductive film CL1_B may contact the first silicide pattern MSC1.

The first lower conductive film CL1_B is placed in the first side extension hole LEH1. The first lower conductive film CL1_B may extend along the upper face of the first side extension hole LEH1, the second sidewall MSC1_S2 of the first silicide pattern MSC1, and the lower face of the first side extension hole LEH1. The first lower conductive film CL1_B may extend along the profile of the first side extension hole LEH1.

The first lower conductive films CL1_B placed in each first side extension hole LEH1 are separated from each other. Since the first lower conductive films CL1_B adjacent to each other in the third direction D3 are separated by the first mold insulating layer ILD1, the first lower conductive films CL1_B adjacent to each other in the third direction D3 are not connected.

In the semiconductor device according to some embodiments, the thickness t11 of the first lower conductive film CL1_B on the upper face of the first side extension hole LEH1 may be the same as the thickness t12 of the first lower conductive film CL1_B on the sidewall of the first side extension hole LEH1. For example, the first lower conductive film CL1_B may be formed at a uniform thickness along the profile of the first side extension hole LEH1.

The first capacitor dielectric film DL1 may be placed on the first lower conductive film CL1_B. The first upper conductive film CL1_U may be placed on the first capacitor dielectric film DL1. The first capacitor dielectric film DL1 and the first upper conductive film CL1_U may be sequentially placed on the first lower conductive film CL1_B.

For example, the first capacitor dielectric film DL1 and the first upper conductive film CL1_U placed on each first side extension hole LEH1 may be connected to each other.

The first lower conductive film CL1_B and the first upper conductive film CL1_U may include, for example, but are not limited to, a doped semiconductor material, a conductive metal nitride (e.g., titanium nitride, tantalum nitride, niobium nitride and/or tungsten nitride), metals (e.g., ruthenium, iridium, titanium, niobium, tungsten, cobalt, molybdenum and/or tantalum), and/or conductive metal oxides (e.g., iridium oxide and/or niobium oxide). As an example, the first lower conductive film CL1_B may include at least one of a conductive metal nitride, a metal, and/or a conductive metal oxide. The conductive metal nitrides, the metals, and the conductive metal oxides may be included in the metal conductive films.

The first capacitor dielectric film DL1 may include, for example, a high dielectric constant material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, and/or a combination thereof). In the semiconductor device according to some embodiments, the first capacitor dielectric film DL1 may include a stacked film structure in which zirconium oxide, aluminum oxide and zirconium oxide are sequentially stacked. In the semiconductor device according to some embodiments, the first capacitor dielectric film DL1 may include hafnium (Hf).

Figure 5:
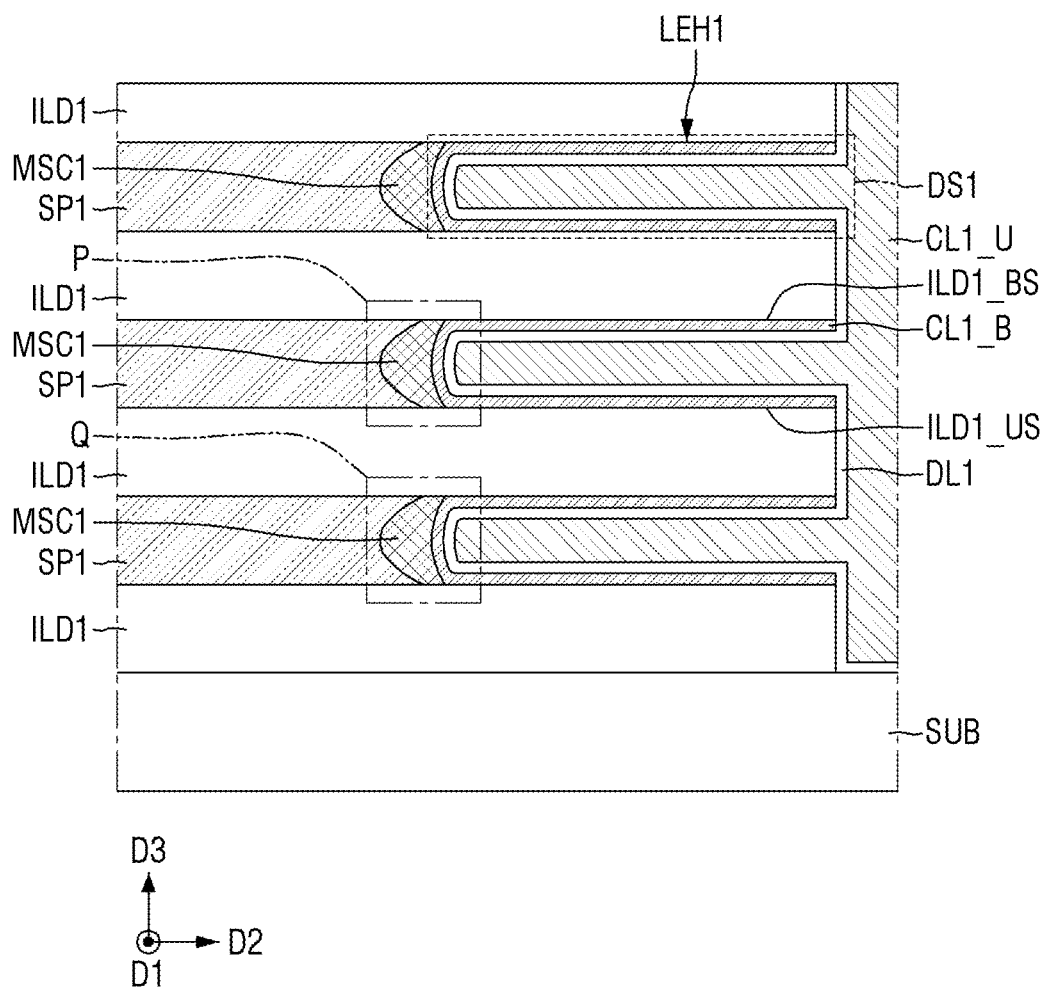
FIG. 5 is a diagram for explaining a semiconductor device according to some embodiments.
Figure 6:
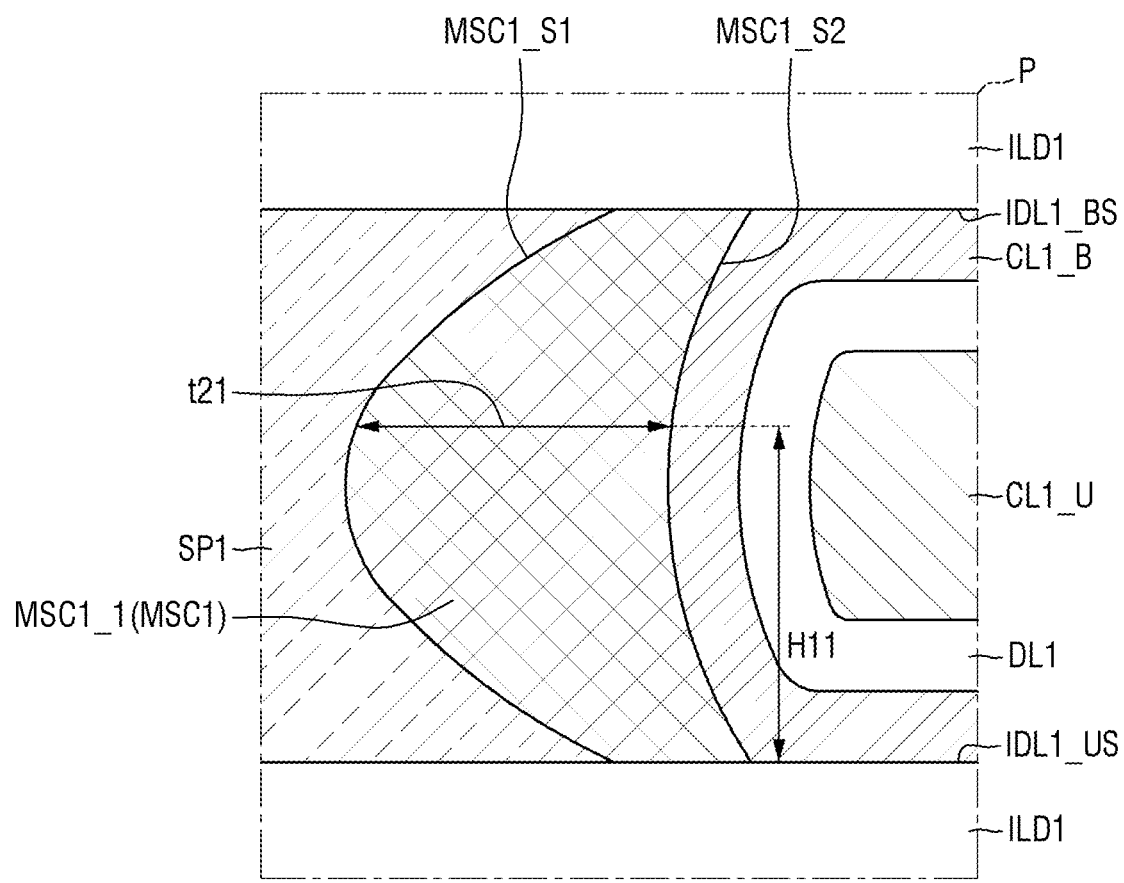
FIGS. 6 and 7 are enlarged views of portions P and Q of FIG. 5.
Figure 7:
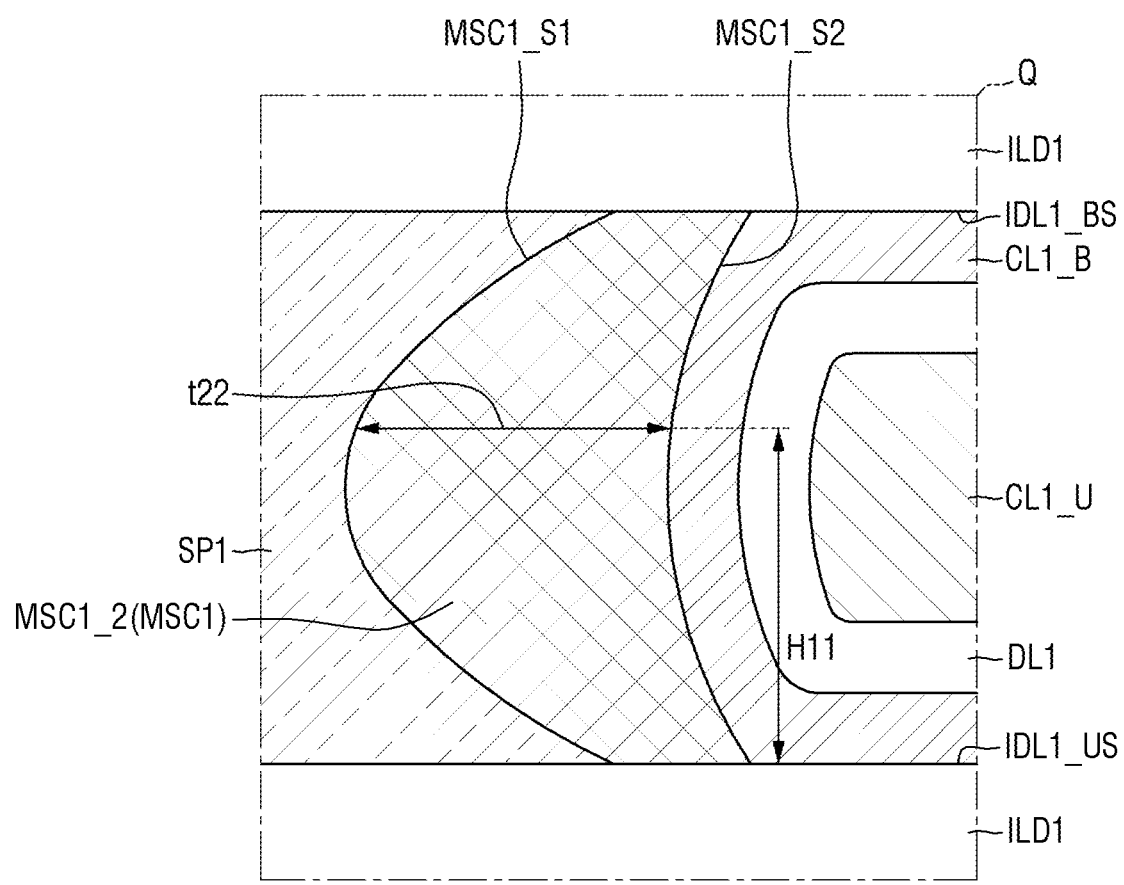

FIG. 5 is a diagram for explaining a semiconductor device according to some embodiments. FIGS. 6 and 7 are enlarged views of portions P and Q of FIG. 5. For convenience of explanation, differences from contents explained using FIGS. 1 to 4 will be mainly explained.

Referring to FIGS. 5 to 7, in the semiconductor device according to some embodiments, the widths t21 and t22 of each first silicide pattern MSC1 in the second direction D2 may increase and then decrease as it goes away from the substrate SUB.

The width t21 of the first_1 silicide pattern MSC1_1 in the second direction D2 may increase and then decrease, as it goes away from the upper face ILD1_US of the first mold insulating layer located below the first_1 silicide pattern MSC1_1.

The width t22 of the first_2 silicide pattern MSC1_2 in the second direction D2 may increase and then decrease, as it goes away from the upper face ILD1_US of the first mold insulating layer located below the first_2 silicide pattern MSC1_2.

At the corresponding points of the first_1 silicide pattern MSC1_1 and the first_2 silicide pattern MSC1_2, the width t21 of the first_1 silicide pattern MSC1_1 in the second direction D2 may be the same as the width t22 of the first_2 silicide pattern MSC1_2 in the second direction D2.

Figure 8:
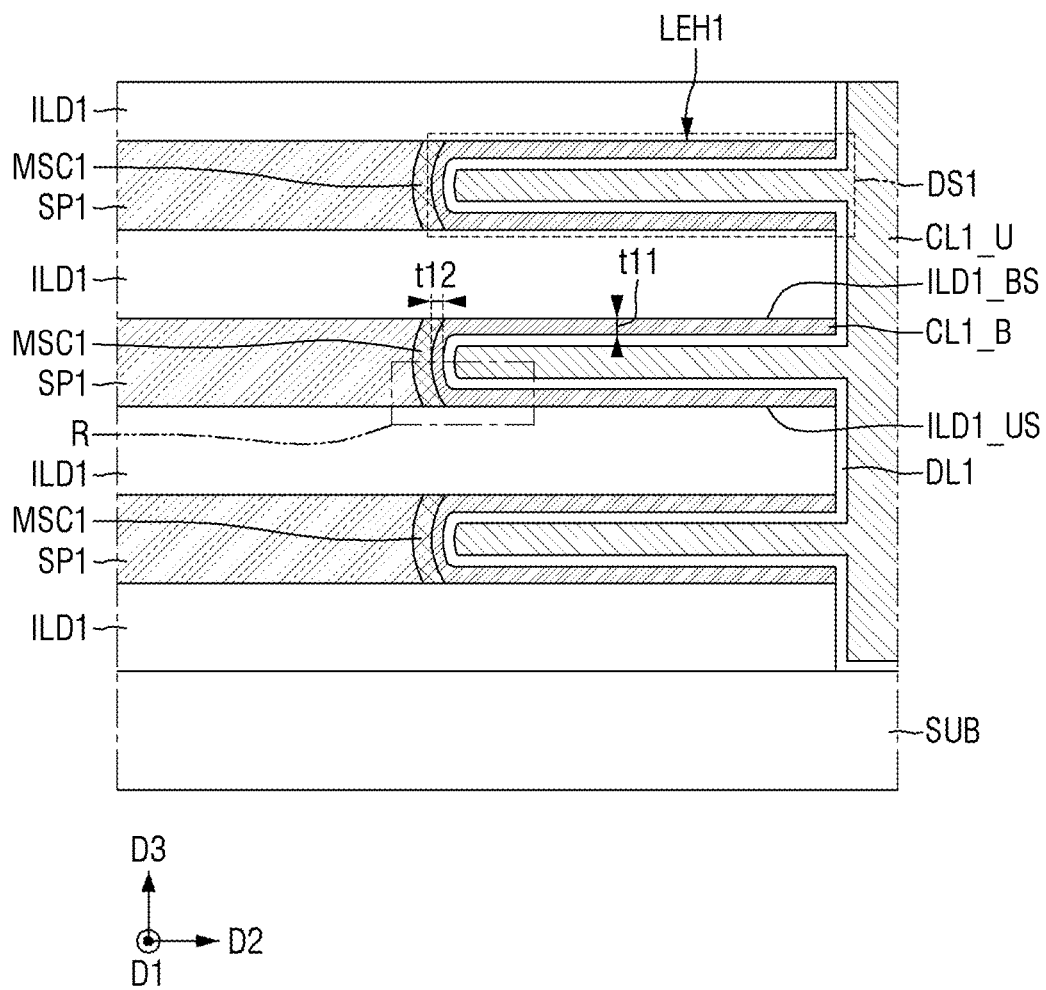
FIG. 8 is a diagram for explaining a semiconductor device according to some embodiments.
Figure 9:
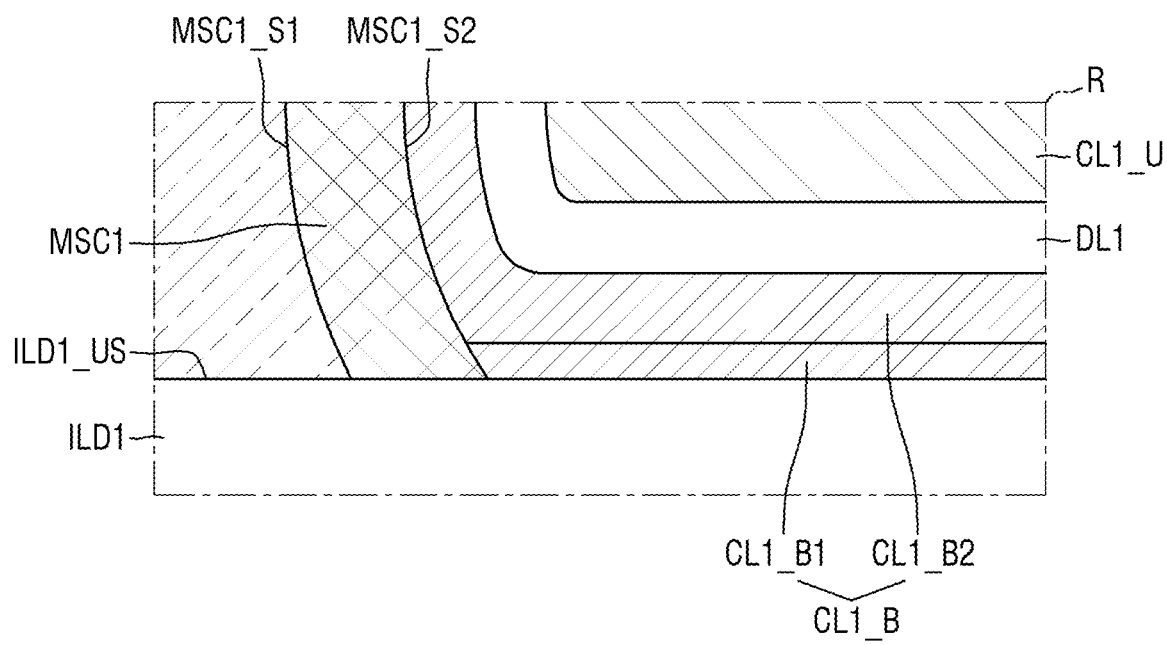
FIGS. 9 to 11 are enlarged schematic views of portion R of FIG. 8.
Figure 10:
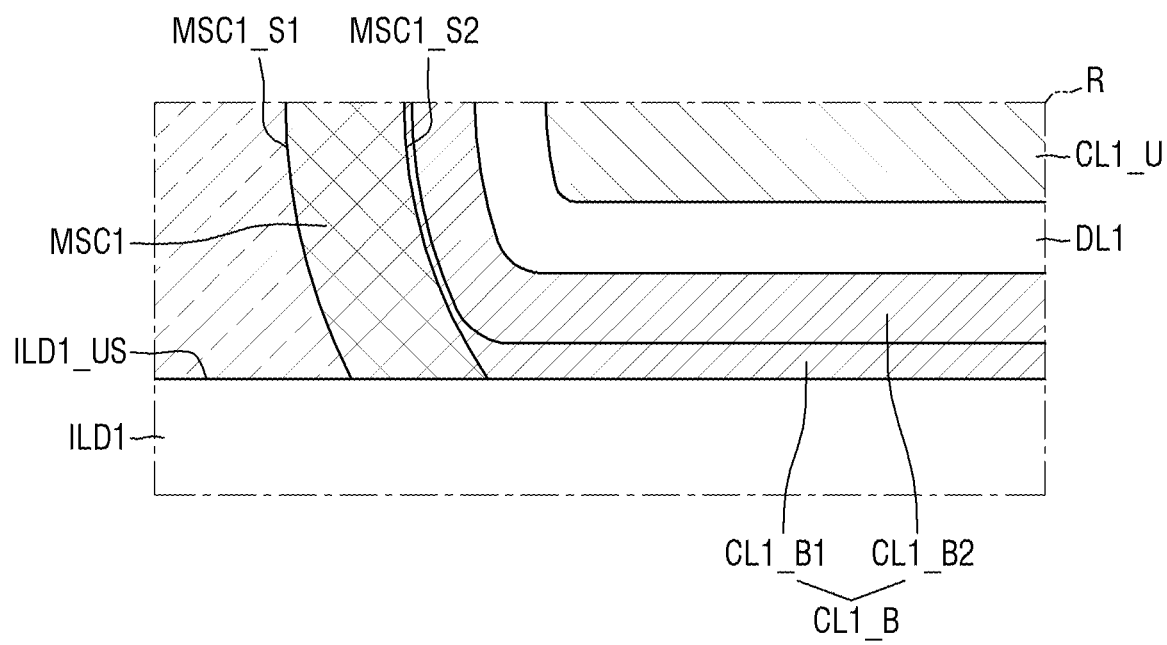
Figure 11:
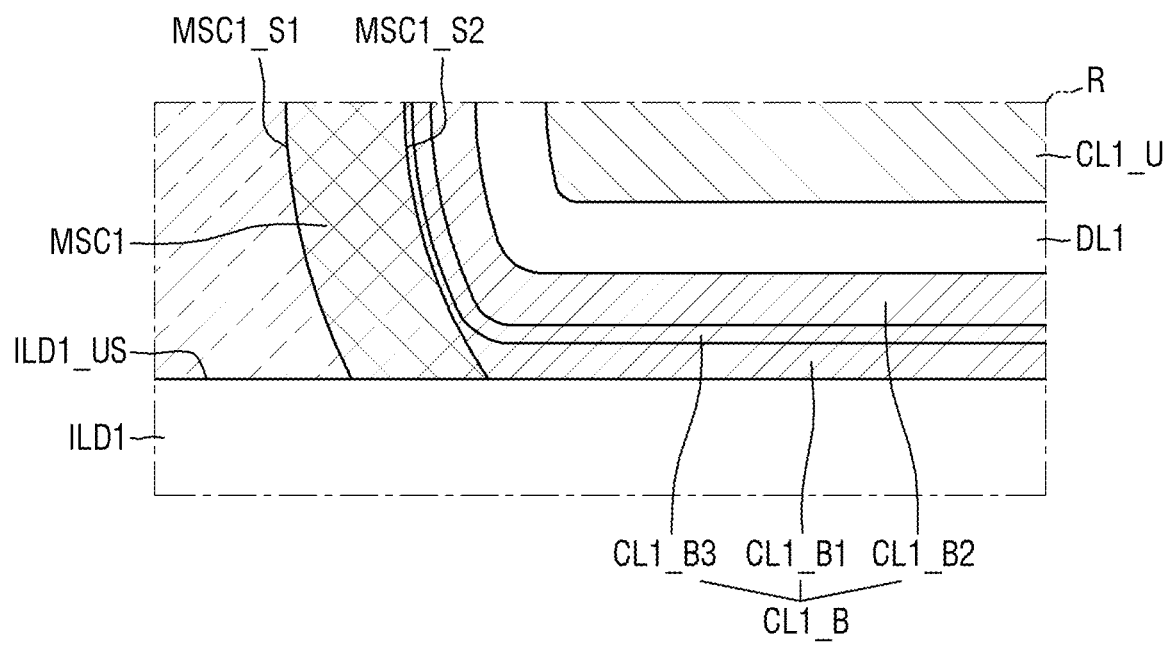

FIG. 8 is a diagram for explaining the semiconductor device according to some embodiments. FIGS. 9 to 11 are enlarged schematic views of portion R of FIG. 8. For convenience of explanation, differences from contents explained using FIGS. 1 to 4 will be mainly explained.

Referring to FIGS. 8 to 11, the thickness t11 of the first lower conductive film CL1_B on the upper face of the first side extension hole LEH1 is thicker than the thickness t12 of the first lower conductive film CL1_B on the sidewall of the first side extension hole LEH1.

In FIGS. 8 and 9, the first lower conductive film CL1_B may include a first_1 lower conductive film CL1_B1 and a first_2 lower conductive film CL1_B2.

The first_1 lower conductive film CL1_B1 and the first_2 lower conductive film CL1_B2 may be sequentially placed on the first mold insulating layer ILD1. The first_1 lower conductive film CL1_B1 may be placed between the first_2 lower conductive film CL1_B2 and the first mold insulating layer ILD1. The first_1 lower conductive film CL1_B1 may include the metal contained in the metal silicide of the first silicide pattern MSC1. In the fabricating process, the first_1 lower conductive film CL1_B1 may be a conductive film that remains after a silicidation process for forming the first silicide pattern MSC1.

In FIG. 9, the first_1 lower conductive film CL1_B1 may extend along the upper face ILD1_US of the first mold insulating layer. However, the first_1 lower conductive film CL1_B1 does not extend along the second sidewall MSC1_S2 of the first silicide pattern. For example, the first_1 lower conductive film CL1_B1 may contact the second sidewall MSC1_S2 of the first silicide pattern, but may maintain a height from the upper face ILD1_US of the first mold insulating layer.

In FIG. 10, the first_1 lower conductive film CL1_B1 may extend along the second sidewall MSC1_S2 of the first silicide pattern. At this time, the thickness of the first_1 lower conductive film CL1_B1 on the upper face ILD1_US of the first mold insulating layer may be thicker than the thickness of the first_1 lower conductive film CL1_B1 on the second sidewall MSC1_S2 of the first silicide pattern.

In FIG. 11, the first lower conductive film CL1_B may further include a first_3 lower conductive film CL1_B3 placed between the first_1 lower conductive film CL1_B1 and the first_2 lower conductive film CL1_B2. The first_3 lower conductive film CL1_B3 may be placed along the profile of the first_2 lower conductive film CL1_B2. The first_3 lower conductive film CL1_B3 may include, for example, a metal nitride obtained by nitriding the metal contained in the first_1 lower conductive film CL1_B1. Though the first_1 lower conductive film CL1_B1 is illustrated as extending along the second sidewall MSC1_S2 of the first silicide pattern, this is only for convenience of explanation and the embodiment is not limited thereto. For example, unlike that shown in FIG. 11, the first_1 lower conductive film CL1_B1 may maintain a height from the upper face ILD1_US of the first mold insulating layer as in FIG. 9.

Figure 12:
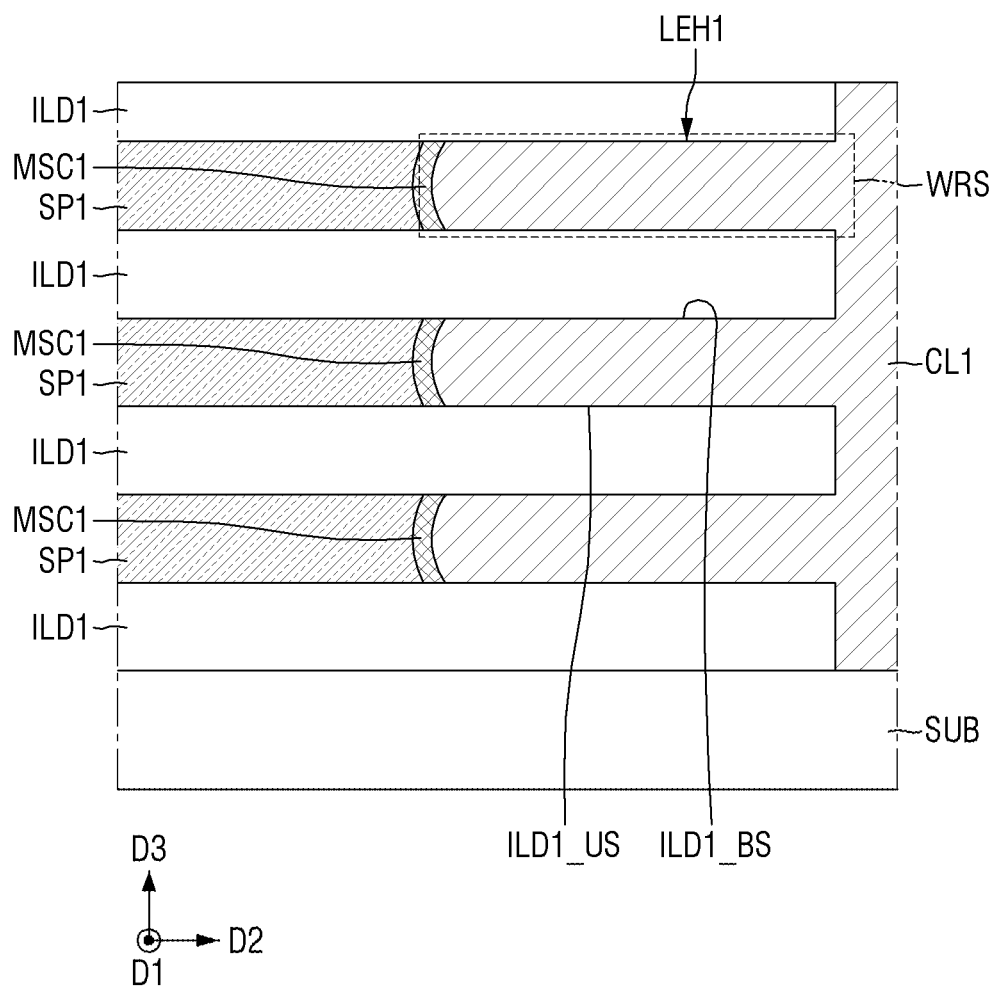
FIG. 12 is a diagram for explaining the semiconductor device according to some embodiments.

FIG. 12 is a diagram for explaining the semiconductor device according to some embodiments. For convenience of explanation, differences from contents explained using FIGS. 1 to 4 will be mainly explained.

Referring to FIG. 12, the semiconductor device according to some embodiments may include a plurality of first conductive films CL1 that entirely fill the first side extension holes LEH1.

Each first conductive film CL1 may be placed between the first mold insulating layers ILD1 adjacent to each other in the third direction D3. Each first conductive film CL1 may entirely fill the first side extension holes LEH1 defined by the first mold insulating layers ILD1 adjacent to each other in the third direction D3.

Each first conductive film CL1 may contact a first silicide pattern MSC1 disposed between the first mold insulating layers ILD1.

The first conductive film CL1 placed in the first side extension hole LEH1 may be a wiring structure WRS. The wiring structure WRS may substitute for the first information storage element (DS1 of FIG. 1). The wiring structure WRS in each first side extension hole LEH1 may be connected by a part of the first conductive film CL1 placed outside the first side extension hole LEH1, but is not limited thereto.

The first conductive film CL1 may include, but is not limited to, for example, a doped semiconductor material, a conductive metal nitride, a metal, a conductive metal oxide, and/or the like.

Figure 13:
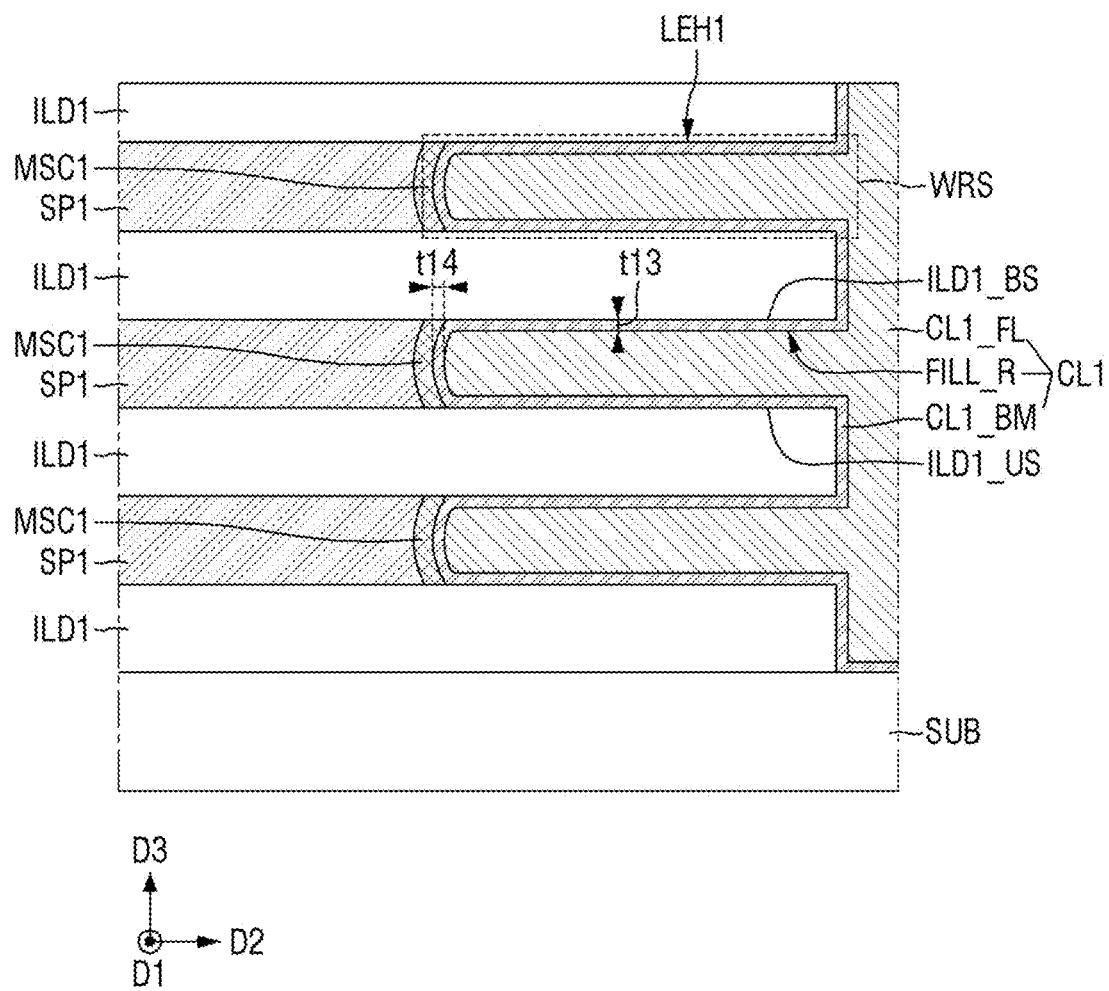
FIG. 13 is a diagram for explaining the semiconductor device according to some embodiments.

FIG. 13 is a diagram for explaining the semiconductor device according to some embodiments. For convenience of explanation, differences from contents explained using FIG. 12 will be mainly explained.

Referring to FIG. 13, in the semiconductor device according to some embodiments, the first conductive film CL1 may include a first barrier conductive film CL1_BM, and a first filling conduction film CL1_FL on the first barrier conductive film CL1_BM.

The first barrier conductive film CL1_BM may contact the first semiconductor pattern SP1. The first barrier conductive film CL1_BM may extend along the profile of the first side extension hole LEH1. The first barrier conductive film CL1_BM extends along the upper face ILD1_US of the first mold insulating layer, the second sidewall MSC1_S2 of the first silicide pattern, and the lower face ILD1_BS of the first mold insulating layer.

The first conductive film CL1 may include a filling recess FILL_R defined by the first barrier conductive film CL1_BM. The first filling conductive film CL1_FL may fill the filling recess FILL_R.

As an example, a thickness t13 of the first barrier conductive film CL1_BM on the upper face of the first side extension hole LEH1 may be the same as a thickness t14 of the first barrier conductive film CL1_BM on the sidewall of the first side extension hole LEH1.

As another example, the thickness t13 of the first barrier conductive film CL1_BM on the upper face of the first side extension hole LEH1 may be thicker than the thickness t14 of the first barrier conductive film CL1_BM on the sidewall of the first side extension hole LEH1. In such a case, the first barrier conductive film CL1_BM may have a structure and/or composition similar to that explained using FIGS. 9 to 11.

Figure 14:
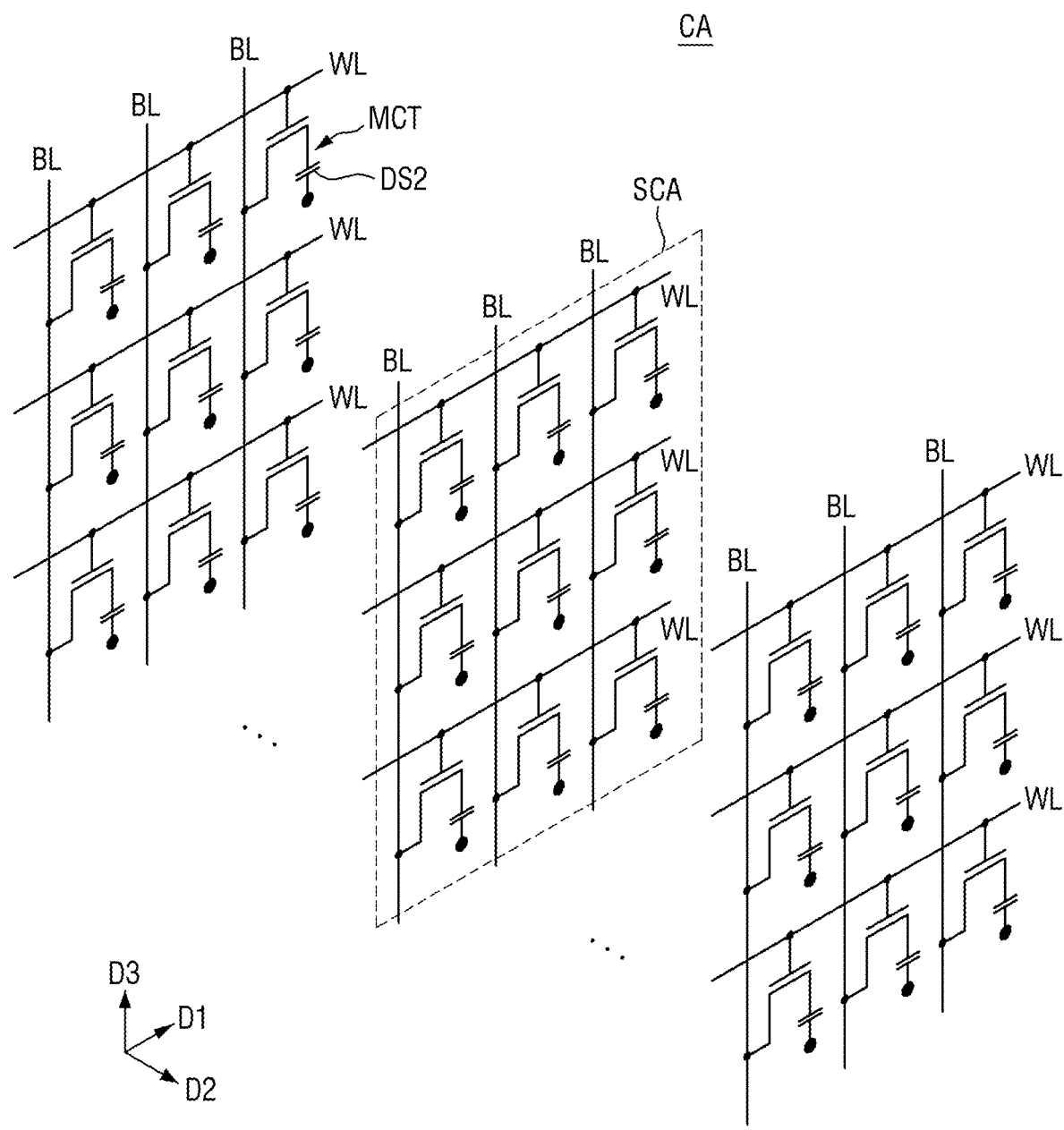
FIG. 14 is a schematic circuit diagram showing a cell array of a three-dimensional semiconductor device according to some embodiments.

FIG. 14 is a schematic circuit diagram showing a cell array of a three-dimensional semiconductor device according to some embodiments.

Referring to FIG. 14, the cell array CA of the three-dimensional semiconductor device according to some embodiments may include a plurality of sub-cell arrays SCA. The sub-cell arrays SCA may be arranged along the second direction D2.

Each sub-cell array SCA may include a plurality of bit lines BL, a plurality of word lines WL, and a plurality of memory cell transistors MCT. One memory cell transistor MCT may be placed between one word line WL and one bit line BL.

The bit lines BL may be conductive patterns (e.g., metal conductive lines) extending in a direction (e.g., the third direction D3) perpendicular to the substrate. The bit lines BL in one sub-array SCA may be placed in the first direction D1. The bit lines BL adjacent to each other may be spaced apart from each other in the first direction D1.

The word lines WL may be conductive patterns (e.g., metal conductive lines) stacked on the substrate in the third direction D3. Each word line WL may extend in the first direction D1. The word lines BL adjacent to each other may be spaced apart from each other in the third direction D3.

A gate of the memory cell transistor MCT may be connected to the word line WL, and a first source/drain of the memory cell transistor MCT may be connected to the bit line BL. A second source/drain of the memory cell transistor MCT may be connected to a second information storage element DS2. For example, the second information storage element DS2 may be a capacitor. The second source/drain of the memory cell transistor MCT may be connected to the lower electrode of the capacitor.

FIGS. 15 to 18 are perspective views showing a three-dimensional semiconductor device according to some embodiments, respectively.

Figure 15:
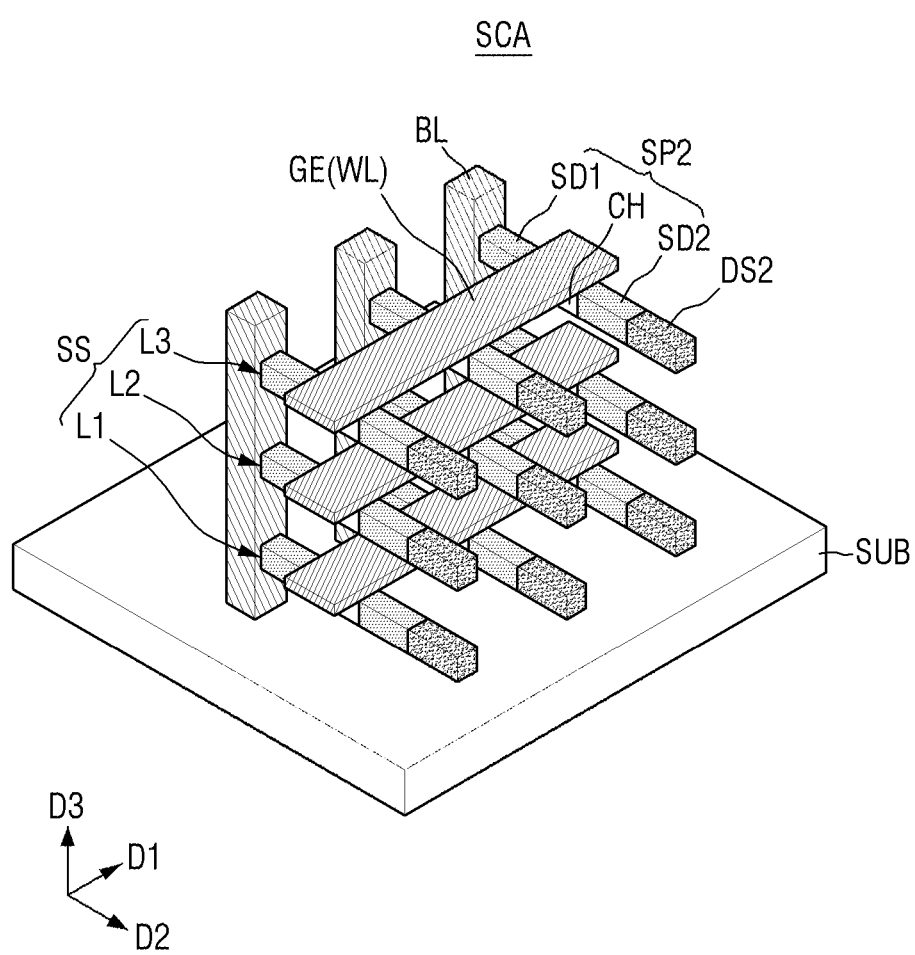
FIGS. 15 to 18 are perspective views showing a three-dimensional semiconductor device according to some embodiments, respectively.

Referring to FIGS. 14 and 15, one of the plurality of sub-cell arrays SCA explained using FIG. 14 may be provided on the substrate SUB.

For example, a stacked structure SS including first to third layers L1, L2, and L3 may be provided on the substrate SUB. The first to third layers L1, L2, and L3 of the stacked structure SS may be spaced apart from each other in a vertical direction (e.g., the third direction D3). Each of the first to third layers L1, L2, and L3 may include a plurality of second semiconductor patterns SP2, a plurality of second information storage elements DS2 and a gate electrode GE.

The second semiconductor pattern SP2 may have a line shape or a bar shape extending in the second direction D2. The second semiconductor pattern SP2 may include semiconductor materials such as silicon, germanium, or silicon-germanium. As an example, the second semiconductor pattern SP2 may include one of polysilicon, polysilicon germanium, single crystal silicon, and/or single crystal silicon-germanium.

Each second semiconductor pattern SP2 may include a channel region CH, a first impurity region SD1 and a second impurity region SD2. The channel region CH may be interposed between the first and second impurity regions SD1 and SD2. The channel region CH may correspond to a channel of the memory cell transistor MCT explained using FIG. 14. The first and second impurity regions SD1 and SD2 may correspond to the first source/drain and the second source/drain of the memory cell transistor MCT explained using FIG. 14, respectively.

The first and second impurity regions SD1 and SD2 may be regions in which the second semiconductor pattern SP2 is doped with impurities. Therefore, the first and second impurity regions SD1 and SD2 may have an n-type or p-type conductive type. The first impurity region SD1 may be formed adjacent to a first end of the second semiconductor pattern SP2, and the second impurity region SD2 may be formed adjacent to a second end of the second semiconductor pattern SP2. The second end may face the first end in the second direction D2.

The second information storage element DS2 may be connected to the second end of the second semiconductor pattern SP2. The second information storage element DS2 may be connected to the second impurity regions SD2 of the second semiconductor pattern SP2. The second information storage element DS2 may be memory elements that may store data. Each second information storage element DS2 may be a memory element using a capacitor, a memory element using a magnetic tunnel junction pattern or a memory element using a variable resistor including a phase change material. As an example, each second information storage element DS2 may be a capacitor.

The gate electrode GE may have a line shape or bar shape that extends in the first direction D1. The gate electrodes GE may be spaced apart from each other along the third direction D3. Each gate electrode GE may extend in the first direction D1 across the second semiconductor pattern SP2 inside a single layer. For example, the gate electrode GE may be horizontal and/or equivalent to the word lines WL explained using FIG. 14.

The gate electrode GE may include a conductive material. As an example, the gate electrode GE may include, but is not limited to, at least one of a doped semiconductor material (doped silicon, doped germanium, etc.), a conductive metal nitride (titanium nitride, tantalum nitride, etc.), a metal (tungsten, titanium, tantalum, etc.), and metal-semiconductor compounds (tungsten silicide, cobalt silicide, titanium silicide, etc.).

A plurality of bit lines BL extending in the vertical direction (e.g., the third direction D3) may be provided on the substrate SUB. Each bit line BL may have a line shape and/or a column shape that extends in the vertical direction (e.g., the third direction D3). The bit lines BL may be arranged along the first direction D1. Each bit line BL may be electrically connected to the first impurity region SD1 of the vertically stacked second semiconductor pattern SP2.

The bit line BL may include a conductive material, and may include, for example, but is limited thereto, at least one of a doped semiconductor material, a conductive metal nitride, a metal, and a metal-semiconductor compound. The bit line BL may be the vertical bit lines BL explained using FIG. 14.

A first layer L1 among the first to third layers L1, L2, and L3 will be representatively explained in detail. The second semiconductor patterns SP2 of the first layer L1 may be arranged in the first direction D1. The second semiconductor patterns SP2 of the first layer L1 may be located at the same level as each other. The gate electrode GE of the first layer L1 may extend in the first direction D1 across the second semiconductor pattern SP2 of the first layer L1. For example, the gate electrode GE of the first layer L1 may be provided on the upper face of the second semiconductor pattern SP2.

Although not shown, a gate insulating film may be interposed between the gate electrode GE and the channel region CH. The gate insulating film may include at least one of a high dielectric constant insulating film, a silicon oxide film, a silicon nitride film, and/or a silicon oxide nitride film. As an example, the high dielectric constant insulating film may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

Each bit line BL may be connected to the first end of the second semiconductor pattern SP2 of the first layer L1. As an example, the bit line BL may be directly connected to the first impurity regions SD1. As another example, the bit line BL may be electrically connected to the first impurity region SD1 through the metal silicide. The specific explanation of the second layer L2 and the third layer L3 may be substantially the same as that of the above-mentioned first layer L1.

Although not shown, empty spaces in the stacked structure SS may be filled with an insulating material. For example, the insulating material may include at least one of a silicon oxide film, a silicon nitride film, and a silicon oxide nitride film. A wiring layer electrically connected to the sub-cell array SCA may be placed on the stacked structure SS.

Although not shown, a peripheral circuit, which operates the sub-cell arrays SCA, may be formed on the substrate SUB. The peripheral circuit and the sub-cell array may be connected, using the aforementioned wiring layer.

Hereinafter, in the embodiments shown in FIGS. 16 to 18, detailed explanation of the technical features that overlap those previously explained referring to FIGS. 14 and 15 will be omitted, and the differences will be explained in detail.

Figure 16:
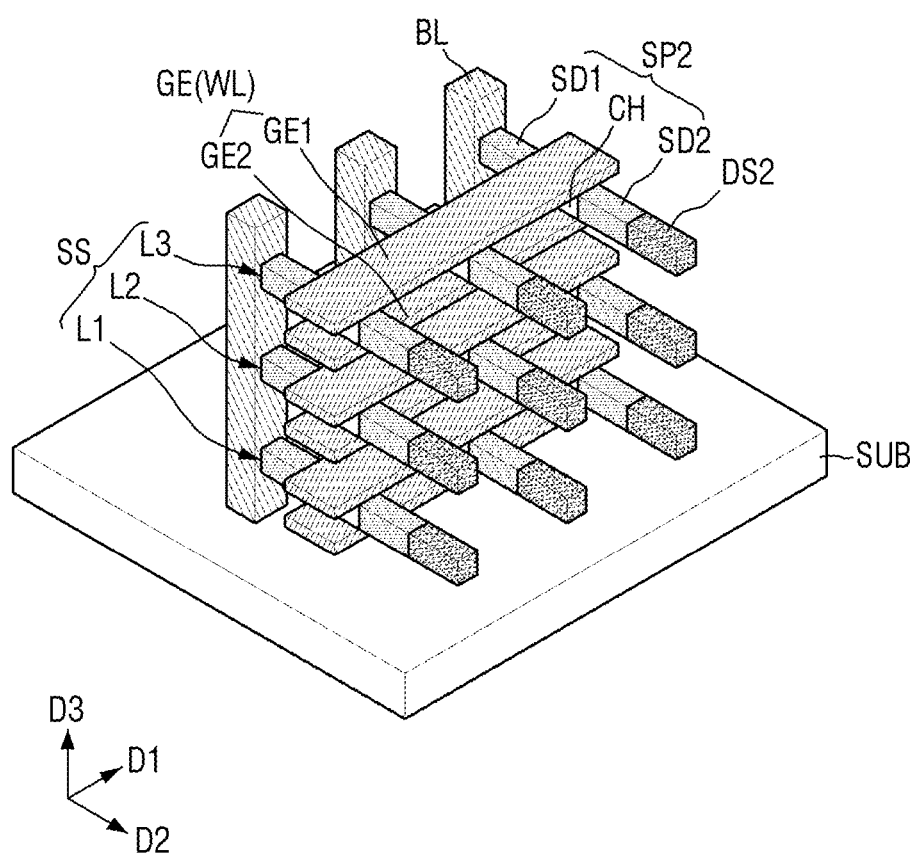

Referring to FIGS. 14 and 16, the gate electrode GE may include a first gate electrode GE1 on the upper face of the second semiconductor pattern SP2, and a second gate electrode GE2 on the lower face of the second semiconductor pattern SP2.

For example, in the semiconductor device according to some embodiments, the memory cell transistor may be a double gate transistor in which the gate electrodes GE are provided on both sides of the channel region CH.

Figure 17:
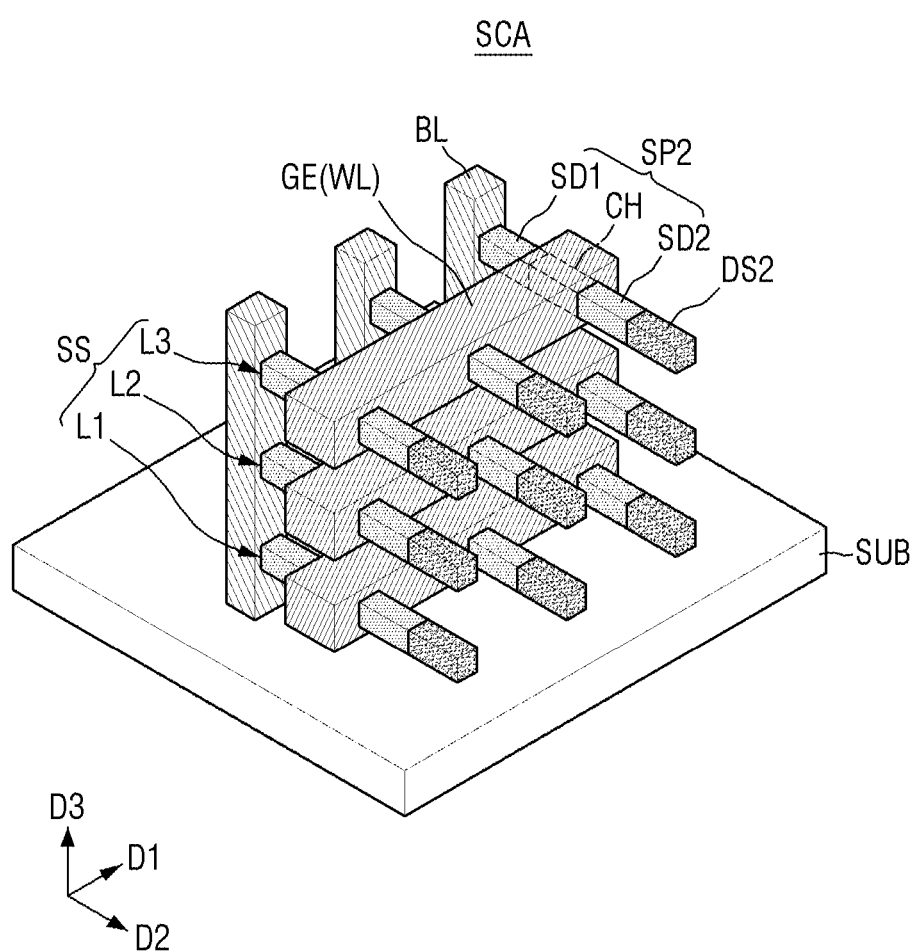

Referring to FIGS. 14 and 17, the gate electrode GE may surround the channel region CH of the second semiconductor pattern SP2. The gate electrode GE may be provided on the upper face, the bottom surface, and at least two sidewalls of the channel region CH.

For example, in the semiconductor device according to some embodiments, the memory cell transistor may be a gate-all-around transistor in which the gate electrode GE surrounds the channel region CH.

In some example embodiments, the gate electrodes GE may include the first gate electrode GE1 and the second gate electrode GE2 explained in FIG. 16, and a connecting gate electrode that connects the first gate electrode GE1 and the second gate electrode GE2. The connecting gate electrode may be placed between the second semiconductor patterns SP2 placed to be spaced apart in the first direction D1 at the same level.

Figure 18:
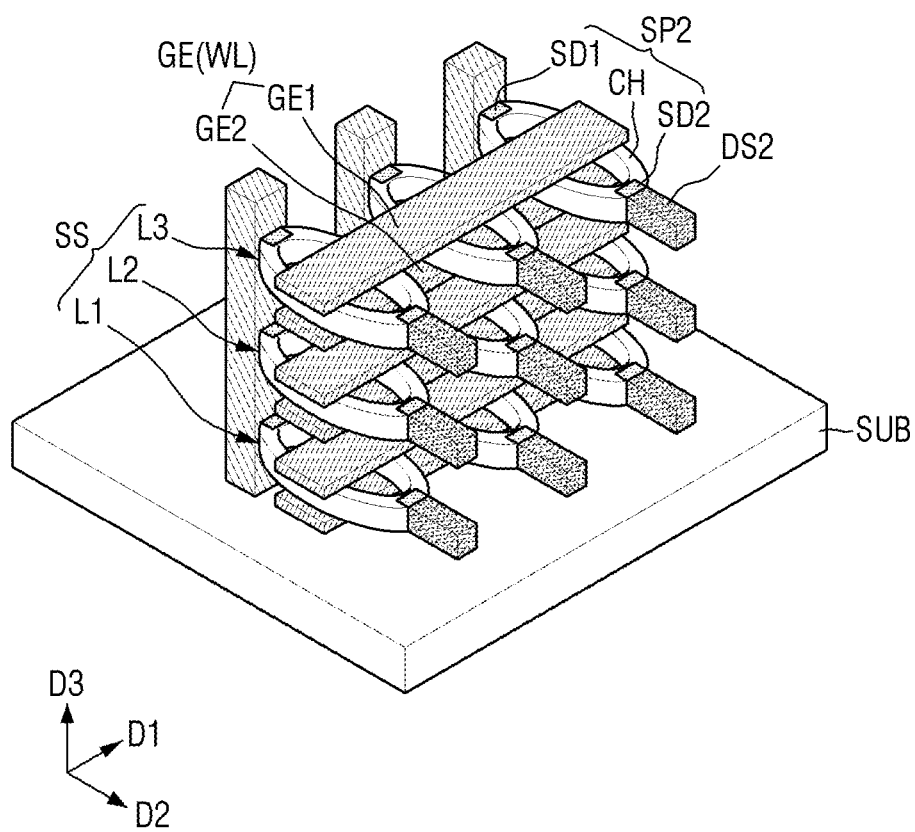

Referring to FIGS. 14 and 18, from a planar viewpoint, the second semiconductor pattern SP2 may have a closed-loop shape. For example, the second semiconductor pattern SP2 may have an annular shape, or the second semiconductor pattern SP2 may also have a loop shape having a rectangular shape with a chamfered outer peripheral surface.

Further, the gate electrode GE may include the first gate electrode GE1 on the upper face of the second semiconductor pattern SP, and/or the second gate electrode GE2 on the lower face of the second semiconductor pattern SP2. Although not shown, the gate electrode GE may also include a connecting gate electrode that connects the first gate electrode GE1 and the second gate electrode GE2, between the second semiconductor patterns SP2 placed to be spaced apart in the first direction D1 at the same level.

Figure 19:
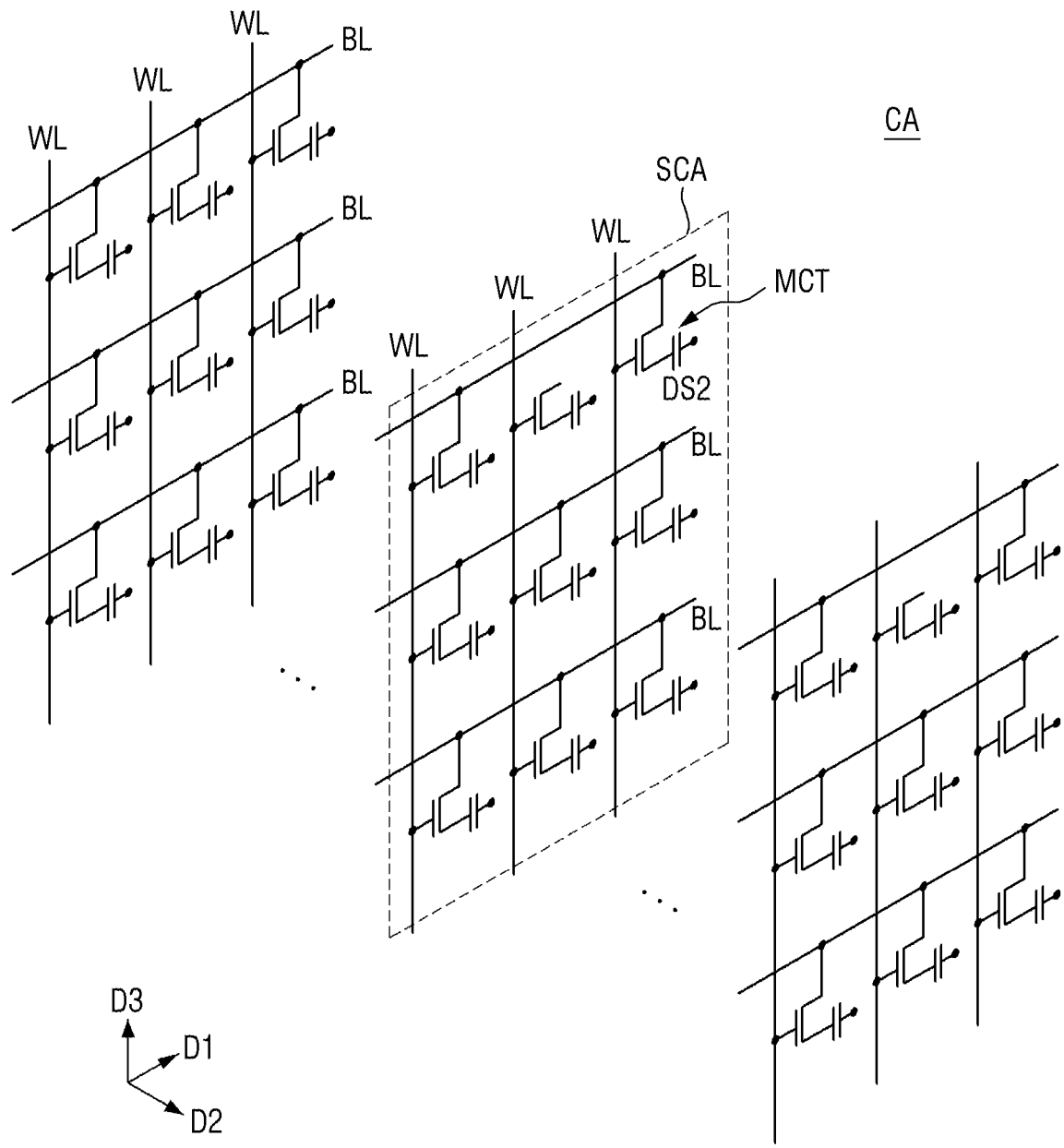
FIG. 19 is a schematic circuit diagram showing a cell array of a three-dimensional semiconductor device according to some embodiments.

FIG. 19 is a schematic circuit diagram showing a cell array of a three-dimensional semiconductor device according to some embodiments. For convenience of explanation, differences from contents explained using FIG. 14 will be mainly explained.

The bit line BL may be conductive patterns (e.g., metal conductive lines) stacked on the substrate in the third direction D3. Each bit line BL may extend in the first direction D1. The bit lines BL adjacent to each other may be spaced apart from each other in the third direction D3.

The word lines WL may include conductive patterns (e.g., metal conductive lines) extending in a direction perpendicular to the substrate (e.g., the third direction D3). The word lines WL within one sub-array SCA may be arranged in the first direction D1. The word lines WL adjacent to each other may be spaced apart from each other in the first direction D1.

Figure 20:
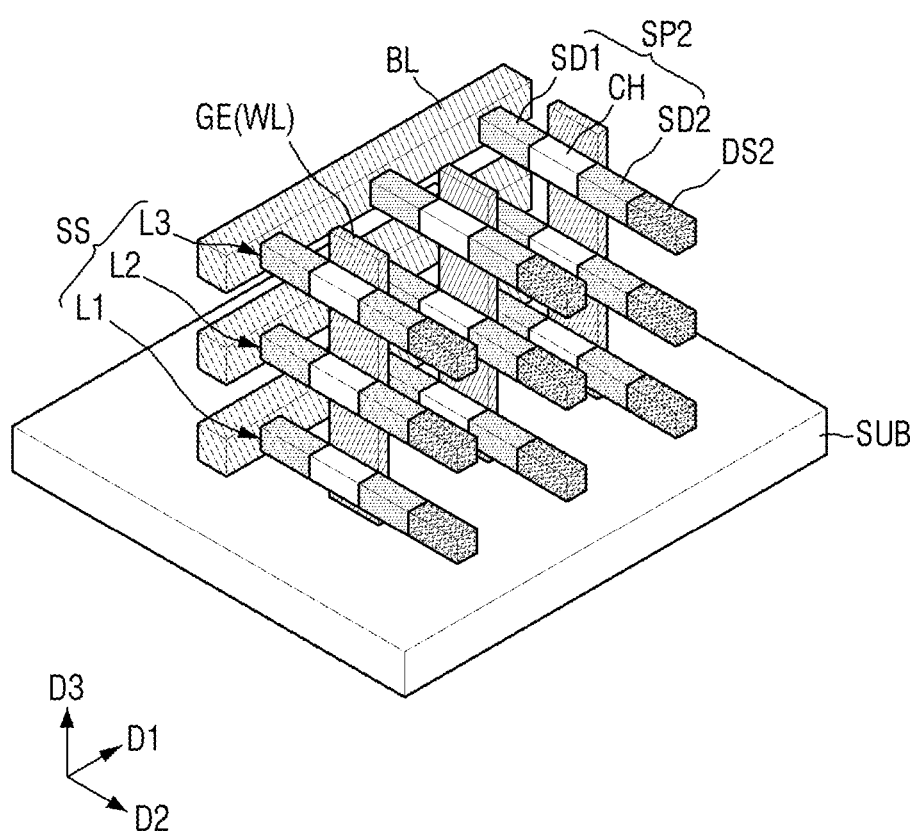
FIGS. 20 and 21 are perspective views showing a three-dimensional semiconductor device according to some embodiments, respectively.
Figure 21:
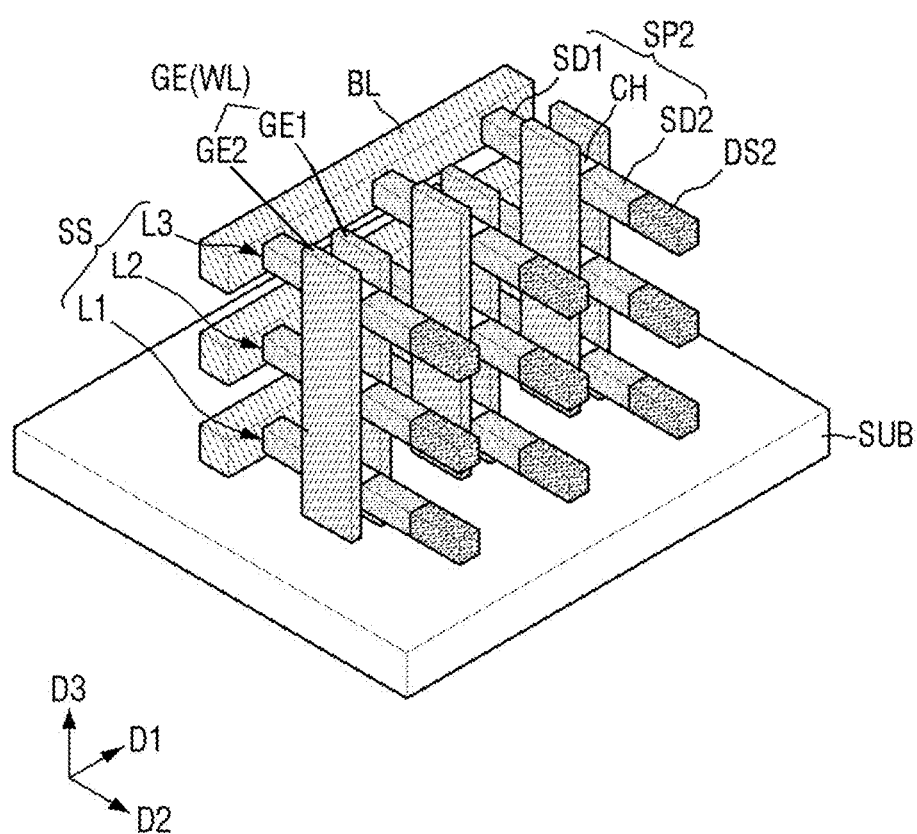

FIGS. 20 and 21 are perspective views showing a three-dimensional semiconductor device according to some embodiments, respectively. FIGS. 20 and 21 may correspond to the circuit diagram explained using FIG. 19. For convenience of explanation, differences from contents explained using FIGS. 14 and 15 will be mainly explained.

Referring to FIGS. 19 and 20, the gate electrode GE may have a line and/or bar shape that extends in the third direction D3. The gate electrodes GE may be spaced apart from each other along the first direction D1. Each gate electrode GE may extend in the third direction D3 across the second semiconductor pattern SP2 stacked in the third direction D3. The gate electrode GE may be placed on a sidewall of the second semiconductor pattern SP2. For example, the sidewall may connect the upper face and the lower face of the second semiconductor pattern SP2.

A plurality of bit lines BL extending in the first direction D1 may be provided on the substrate SUB. Each bit line BL may have a line shape and/or a column shape that extends in the first direction D1. The bit lines BL may be spaced part from each other long the third direction D3. Each bit line BL may be electrically connected to the first impurity region SD1 of the second semiconductor pattern SP2 at corresponding heights.

Referring to FIGS. 19 and 21, the gate electrode GE may include a first gate electrode GE1 and a second gate electrode GE2 placed on the both sidewalls of the second semiconductor pattern SP2.

For example, both sidewalls of the second semiconductor pattern SP2 may connect the upper face and the lower face of the second semiconductor pattern SP2.

Figure 22:
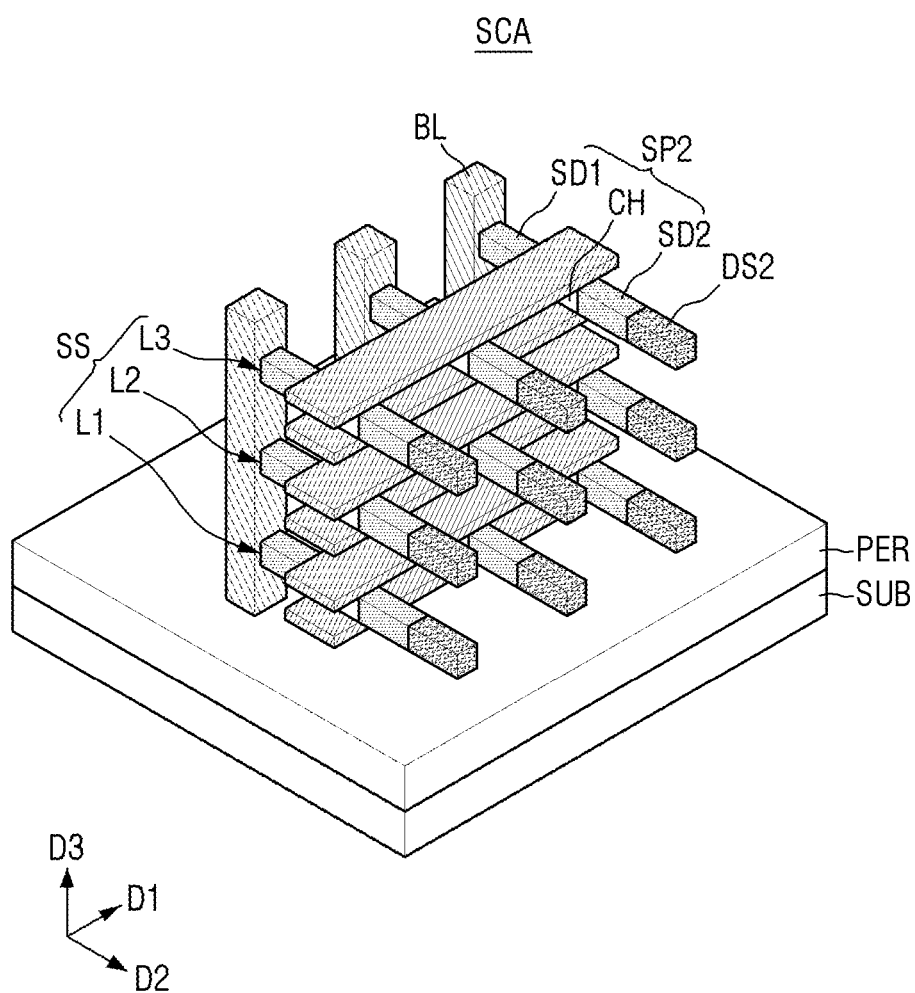
FIGS. 22 and 23 are perspective views showing a three-dimensional semiconductor device according to some embodiments, respectively.
Figure 23:
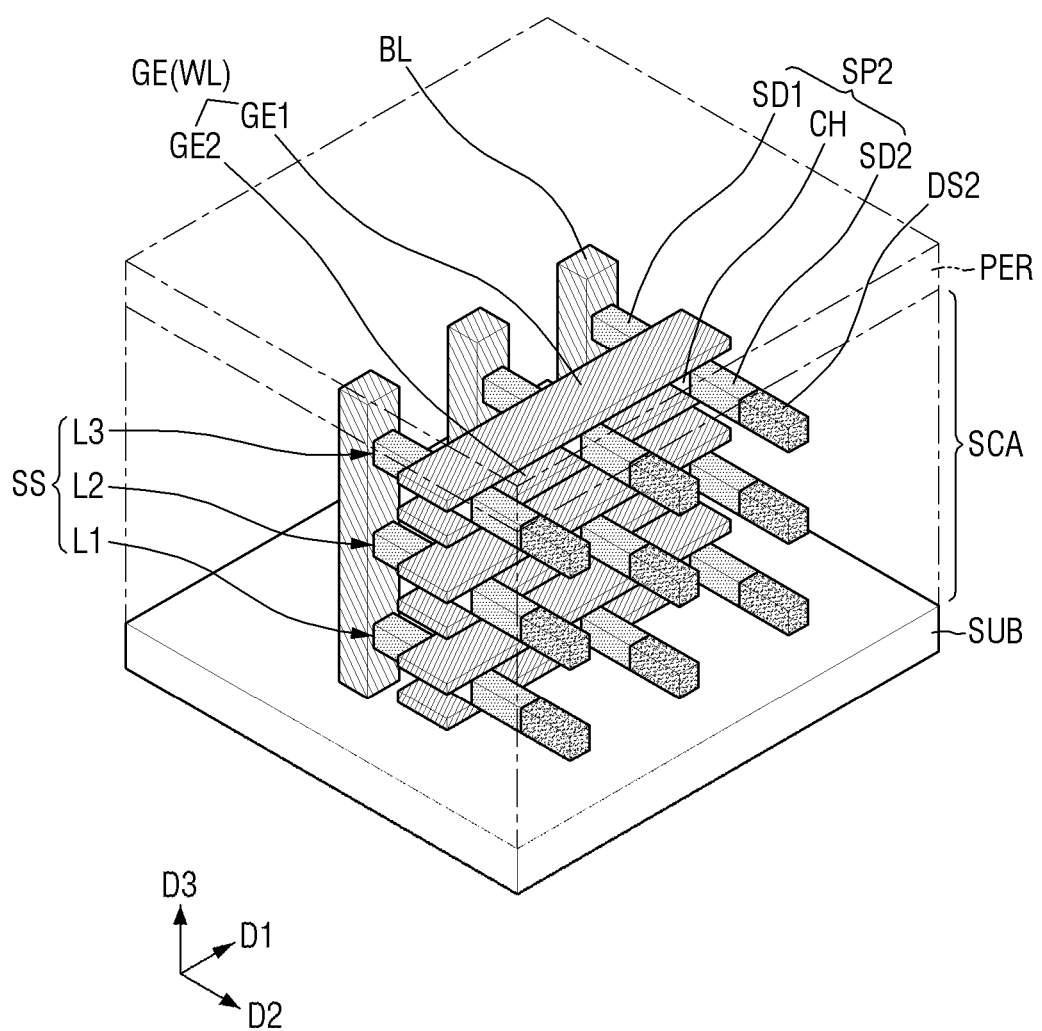

FIGS. 22 and 23 are perspective views showing a three-dimensional semiconductor device according to some embodiments, respectively. For convenience of explanation, differences from contents explained using FIG. 16 will be mainly explained.

For reference, although each of FIGS. 22 and 23 is shown using FIG. 16, the embodiments are not limited thereto. The structure of the sub-cell array SCA of FIGS. 22 and 23 may, of course, have the structure explained above, for example, in FIGS. 15, 17, 18, 20, and 21.

Referring to FIG. 22, a peripheral circuit region PER may be provided on the substrate SUB.

The peripheral circuit region PER may include a circuit for operating the three-dimensional semiconductor device according to some embodiments. For example, the peripheral circuit region PER may include peripheral transistors (not illustrated) provided on the substrate SUB.

A sub-circuit array SCA explained above may be placed on the peripheral circuit region PER. For example, a stacked structure SS including the first to third layers L1, L2, and L3 may be placed on the peripheral circuit region PER.

The wiring layer electrically connected to the sub-array SCA may be electrically connected to the peripheral circuit region PER, for example, through a penetration contact.

Referring to 23, a sub-array SCA may be provided on the substrate SUB. The peripheral circuit region PER may be placed on the sub-cell array SCA.

As mentioned above, the peripheral circuit region PER may include a circuit for operating the sub-cell array SCA.

As an example, the peripheral circuit region PER may be electrically connected to the sub-cell array SCA through, for example, the penetration contact.

As another example, the peripheral circuit region PER may include a peripheral circuit wiring layer that is electrically connected to the circuit for operating the sub-circuit array SCA. The wiring layer electrically connected to the sub-array SCA may be placed to face the peripheral circuit wiring layer of the peripheral circuit region PER. The wiring layer electrically connected to the sub-array SCA may be electrically connected to the peripheral circuit wiring layer of the peripheral circuit region PER, using, for example, a wafer bonding method.

Figure 24:
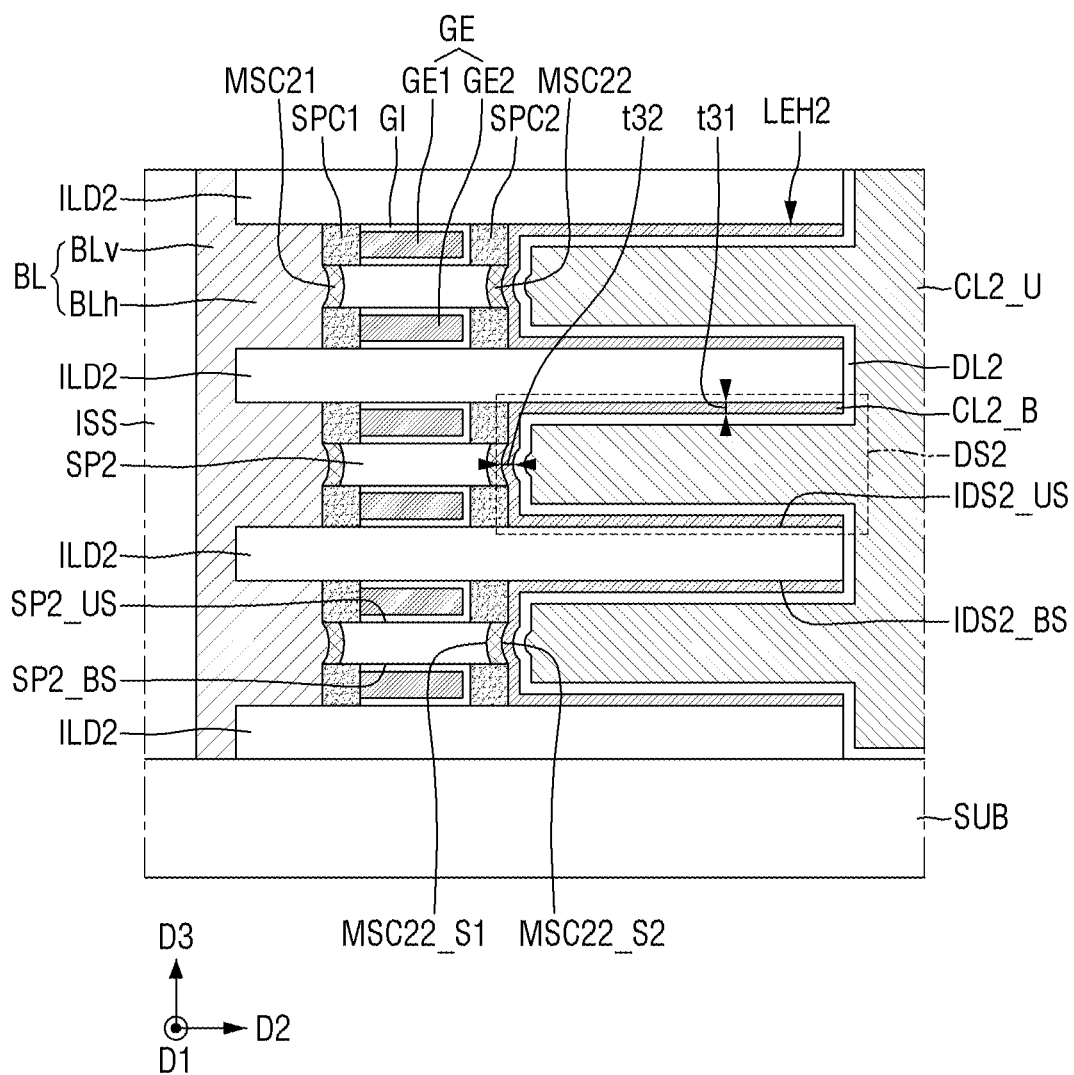
FIG. 24 is a diagram for explaining a semiconductor device according to some embodiments.

FIG. 24 is a diagram for explaining the semiconductor device according to some embodiments. For reference, FIG. 24 is an example cross-sectional view in which portions of the second semiconductor patterns SP2 stacked in the third direction D3 in FIG. 16 or FIG. 17 are taken along the second direction D2. Although FIG. 24 is shown using FIG. 16 or 17, the embodiments are not limited thereto. The structure of the second semiconductor pattern SP2 of FIG. 24 may, of course, have the structure explained above, for example, in FIGS. 15, 18, 20, and 21.

For reference, the contents that may be duplicated with the contents explained using FIGS. 1 to 4 in the explanation of FIG. 24 will be briefly explained.

Referring to FIG. 24, the semiconductor device according to some embodiments may include a plurality of second semiconductor patterns SP2, a plurality of second mold insulating layers ILD2, a plurality of gate electrodes GE, a plurality of second_1 silicide patterns MSC21, a plurality of second_2 silicide pattern MSC22, a plurality of second information storage elements DS2, and a bit line BL.

The plurality of second mold insulating layers ILD2 may be placed on the substrate SUB. Each second mold insulating layer ILD2 may be spaced apart from each other in the third direction D3. Each second mold insulating layer ILD2 may include an upper face ILD2_US and a lower face ILD2_BS which are opposite to each other in the third direction D3.

Since the explanation of the plurality of second mold insulating layers ILD2 may be substantially the same as the explanation of the plurality of first mold insulating layers ILD1 explained using FIGS. 1 to 4, the explanation thereof will not be provided below.

The plurality of second semiconductor patterns SP2 may be placed between the second mold insulating layers ILD2 adjacent to each other in the third direction D3. Each second semiconductor pattern SP2 may be spaced apart from each other in the third direction D3.

Each second semiconductor pattern SP2 may extend in the second direction D2. Each second semiconductor pattern SP2 may overlap a part of the upper face ILD2_US of the second mold insulating layer and a part of the lower face ILD2_BS of the second mold insulating layer which face each other in the third direction D3. Each second semiconductor pattern SP2 may include an upper face SP2_US and a lower face SP2_BS which are opposite to each other in the third direction D3.

The plurality of gate electrodes GE may be placed between second mold insulating layers ILD2 adjacent to each other in the third direction D3. Each gate electrode GE may be placed on each second semiconductor pattern SP2. In some embodiments, each gate electrode GE may extend in the first direction D1.

The gate electrode GE may include a first gate electrode GE1 placed on the upper face SP2_US of the second semiconductor pattern SP2, and a second gate electrode GE2 placed on the lower face SP2_BS of the second semiconductor pattern SP2. The first gate electrode GE1 may be an upper gate electrode, and the second gate electrode GE2 may be a lower gate electrode. Each second semiconductor pattern SP2 may be placed between the first gate electrode GE1 and the second gate electrode GE2.

A gate insulating film GI may be placed between the first gate electrode GE1 and the second semiconductor pattern SP2, and between the first gate electrode GE1 and the second mold insulating layer ILD2. A gate insulating film GI may be placed between the second gate electrode GE2 and the second semiconductor pattern SP2, and between the second gate electrode GE2 and the second mold insulating layer ILD2. Although the gate insulating film GI is shown as being placed on the sidewall of the first gate electrode GE1 and the sidewall of the second gate electrode GE2 extending in the third direction D3, the embodiment is not limited thereto.

The gate insulating film GI may include, for example, at least one of a high dielectric constant insulating film, a silicon oxide film, a silicon nitride film, and/or a silicon oxide nitride film.

The plurality of second_1 silicide patterns MSC21 and the plurality of second_2 silicide patterns MSC22 may be placed between adjacent second mold insulating layers ILD2. Each second_1 silicide pattern MSC21 contacts the first end of the second semiconductor pattern SP2. Each second_2 silicide pattern MSC22 contacts the second end of the second semiconductor pattern SP2. The first end of the second semiconductor pattern SP2 and the second end of the second semiconductor pattern SP2 may be opposite to each other in the second direction D2.

The second_2 silicide patterns MSC22 may be formed, for example, only on the second semiconductor pattern SP2. In some example embodiments, each second_1 silicide pattern MSC21 may be formed only on the second semiconductor pattern SP2. As another example, unlike the shown case, a part of each second_1 silicide pattern MSC21 may extend along the upper face ILD2_US of the second mold insulating layer and the lower face ILD2_BS of the second mold insulating layer.

Each second_2 silicide pattern MSC22 may include a first sidewall MSC22_S1 and a second sidewall MSC22_S2 extending in the third direction D3. Each second_2 silicide pattern MSC22 may correspond to the first silicide pattern MSC1 explained using FIGS. 1 to 4. For example, the explanation of the shape of each second_2 silicide pattern MSC22 and the width in the second direction D2 may be substantially the same as the explanation of the first silicide pattern MSC1 explained using FIGS. 1 to 4. Briefly, at the points corresponding to each other, the widths (e.g., in the second direction D2) of the second_2 silicide patterns MSC22 placed at different heights (e.g., from the substrate SUB) may be the same. Further, in some example embodiments, the width of each first silicide pattern MSC1 in the second direction D2 may be constant.

Unlike the one shown, the shape of the second_2 silicide pattern MSC22 may, of course, be similar to that of the first silicide pattern MSC1 explained using FIGS. 5 to 7. In such a case, the explanation of the shape of each second_2 silicide pattern MSC22 and the width in the second direction D2 may be substantially the same as the description of the first silicide pattern MSC1 explained using FIGS. 5 to 7. Briefly, the width (e.g., in the second direction D2) of each second_2 silicide pattern MSC22 in the second direction D2 may increase and then decrease.

The second_1 silicide pattern MSC21 may a shape similar to that of the second_2 silicide pattern MSC22.

For example, unlike the shown case, the shape of the second_1 silicide pattern MSC21 may, of course, be similar to that of the first silicide pattern MSC1 using referring to FIGS. 5 to 7.

The second_1 silicide pattern MSC21 and the second_2 silicide pattern MSC22 may include a silicidation material of a metal (e.g., a metal-silicon compound) and/or a silicidation material of a metal nitride (metal nitride-silicon compound). The second_1 silicide pattern MSC21 and the second_2 silicide pattern MSC22 may each include, for example, but are not limited to, at least one silicidation material of titanium (Ti), niobium (Nb), molybdenum (Mo), tungsten (W), and/or cobalt (Co).

A first spacer pattern SPC1 and a second spacer pattern SPC2 may be placed between the second semiconductor pattern SP2 and the second mold insulating layer ILD2. The first spacer pattern SPC1 may be placed on the upper face SP2_US of the second semiconductor pattern and on the lower face SP2_BS of the second semiconductor pattern. The second spacer pattern SPC2 may be placed on the upper face SP2_US of the second semiconductor pattern and on the lower face SP2_BS of the second semiconductor pattern.

The first spacer pattern SPC1 may spatially separate the gate electrode GE and the bit line BL. The second spacer pattern SPC2 may spatially separate the gate electrode GE and the second information storage element DS2. In some embodiments, the first spacer pattern SPC1 may electrically isolate the gate electrode GE and the bit line BL. In some embodiments, the second spacer pattern SPC2 may electrically isolate the gate electrode GE and the second information storage element DS2.

The first spacer pattern SPC1 and the second spacer pattern SPC2 may include, for example, at least one of silicon oxide film, silicon nitride film, silicon oxide nitride film, carbon-containing silicon oxide film, carbon-containing silicon nitride film and carbon-containing silicon oxide nitride film, respectively.

The bit line BL may be connected to a plurality of second semiconductor patterns SP2 spaced apart from each other in the third direction D3. The bit line BL may be in contact with the second_1 silicide pattern MSC21, which is in contact with the respective second semiconductor patterns SP2.

In the semiconductor device according to some embodiments, the bit line BL has a vertical portion BLv extending in the third direction D3, and a protruding portion BLh protruding from the vertical portion BLv in the second direction D2. The second_1 silicide pattern MSC21 may contact the protruding portion BLh of the bit line.

A separation insulating structure ISS may be placed on the substrate SUB. The separation insulating structure ISS may spatially and/or electrically separate the bit lines BL adjacent to each other in the second direction D2. The separation insulating structure ISS may include, for example, an insulating material.

A plurality of second side extension holes LEH2 may be defined between the second mold insulating layers ILD2 adjacent to each other in the third direction D3. Each second side extension hole LEH2 may extend in the second direction D2. The second side extension hole LEH2 may extend from the second_2 silicide pattern MSC22 to the distal end of the second mold insulating layer ILD2.

Each second side extension hole LEH2 may be defined by adjacent second mold insulating layers ILD2, and the second_2 silicide pattern MSC22 and the second spacer pattern SPC2 between the second mold insulating layers ILD2.

The upper face of the second side extension hole LEH2 and the lower face LEH2 of the second side extension hole may be defined by the second mold insulating layers ILD2 adjacent to each other in the third direction D3. For example, the upper face of the second side extension hole LEH2 may be defined by the lower face ILD2_BS of the second mold insulating layer, and the lower face of the second side extension hole LEH2 may be defined by the upper face ILD2_US of the second mold insulating layer. The sidewalls of the second side extension hole LEH2 may be defined by the second sidewall MSC22_S2 of the second_2 silicide pattern and the second spacer pattern SPC2.

The explanation of the second side extension hole LEH2 may be similar to that of the first side extension hole LEH1 explained using FIGS. 1 to 13.

A plurality of second information storage elements DS2 may be placed in each second side extension hole LEH2. Each second information storage element DS2 may be connected to the second_2 silicide pattern MSC22. Each second information storage element DS2 may be a capacitor.

The plurality of second information storage elements DS2 may include a second capacitor dielectric film DL2, a second upper conductive film CL2_U, and a plurality of second lower conductive films CL2_B. For example, each second information storage element DS2 may include, in each second side extension hole LEH2, a second lower conductive film CL2_B, a second capacitor dielectric film DL2, and a second upper conductive film CL2_U.

Each second lower conductive film CL2_B may be placed between the second mold insulating layers ILD2 adjacent to each other in the third direction D3. The second lower conductive film CL2_B may be connected to the second_2 silicide pattern MSC22. The second lower conductive film CL2_B may contact the second_2 silicide pattern MSC22.

The second lower conductive film CL2_B may be placed in the second side extension hole LEH2. The second lower conductive film CL2_B may extend along the upper face of the first side extension hole LEH1, the second spacer pattern SPC2, the second sidewall MSC22_S2 of the second_2 silicide pattern, and the lower face of the first side extension hole LEH1. The second lower conductive film CL2_B may extend along the profile of the second side extension hole LEH2.

The second capacitor dielectric film DL2 may be placed on the second lower conductive film CL2_B. The second upper conductive film CL2_U may be placed on the second capacitor dielectric film DL2. The second capacitor dielectric film DL2 and the second upper conductive film CL2_U may be sequentially placed on the second lower conductive film CL2_B.

Since the plurality of second information storage elements DS2 may be substantially the same as the explanations of the plurality of first information storage elements DS1 explained using to FIGS. 1 to 4, further explanation thereof will not be provided.

In some example embodiments, a thickness t31 of the second lower conductive film CL2_B on the upper face of the second side extension hole LEH2 may be the same as a thickness t32 of the second lower conductive film CL2_B on the second sidewall MSC22_S2 of the second_2 silicide pattern.

As another example, the thickness t31 of the second lower conductive film CL2_B on the upper face of the second side extension hole LEH2 may be thicker than the thickness t32 of the second lower conductive film CL2_B on the second sidewall MSC22_S2 of the second_2 silicide pattern. In such a case, the thickness of the second lower conductive film CL2_B on the second spacer pattern SPC2 is thicker than the thickness t32 of the second lower conductive film CL2_B on the second sidewall MSC22_S2 of the second_2 silicide pattern. In this case, the second lower conductive film CL2_B may have a structure similar to that of the first lower conductive film CL1_B explained using FIGS. 9 to 11.

Figure 25:
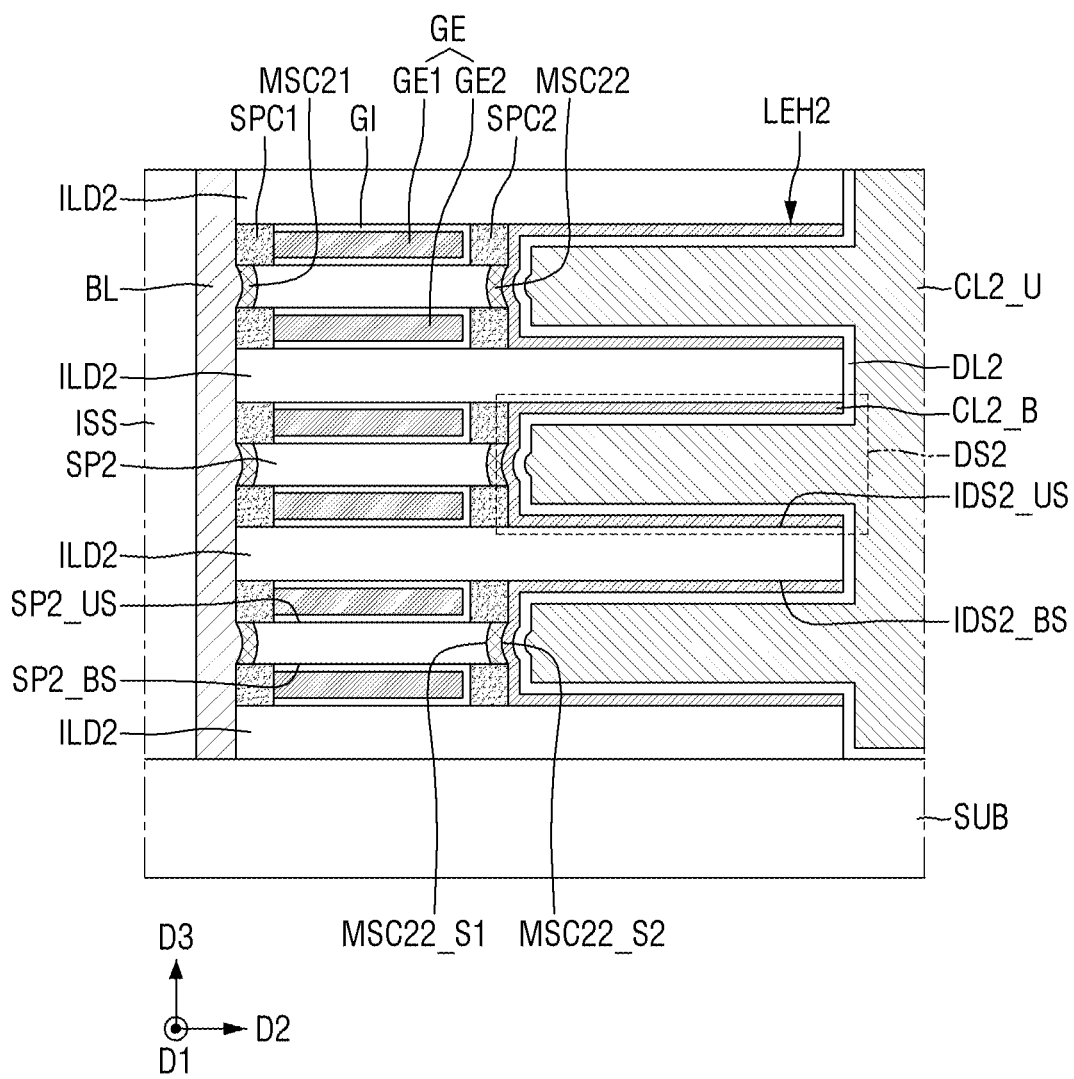
FIG. 25 is a diagram for explaining a semiconductor device according to some embodiments.

FIG. 25 is a diagram for explaining the semiconductor device according to some embodiments. For convenience of explanation, differences from contents explained using FIG. 24 will be mainly explained.

Referring to FIG. 25, in the semiconductor device according to some embodiments, the bit line BL does not include a portion interposed between the second mold insulating layers ILD2 adjacent to each other in the third direction D3.

For example, in some embodiments, the bit line BL includes the vertical portion BLv of FIG. 24, but does not include the protruding portion BLh.

Figure 26:
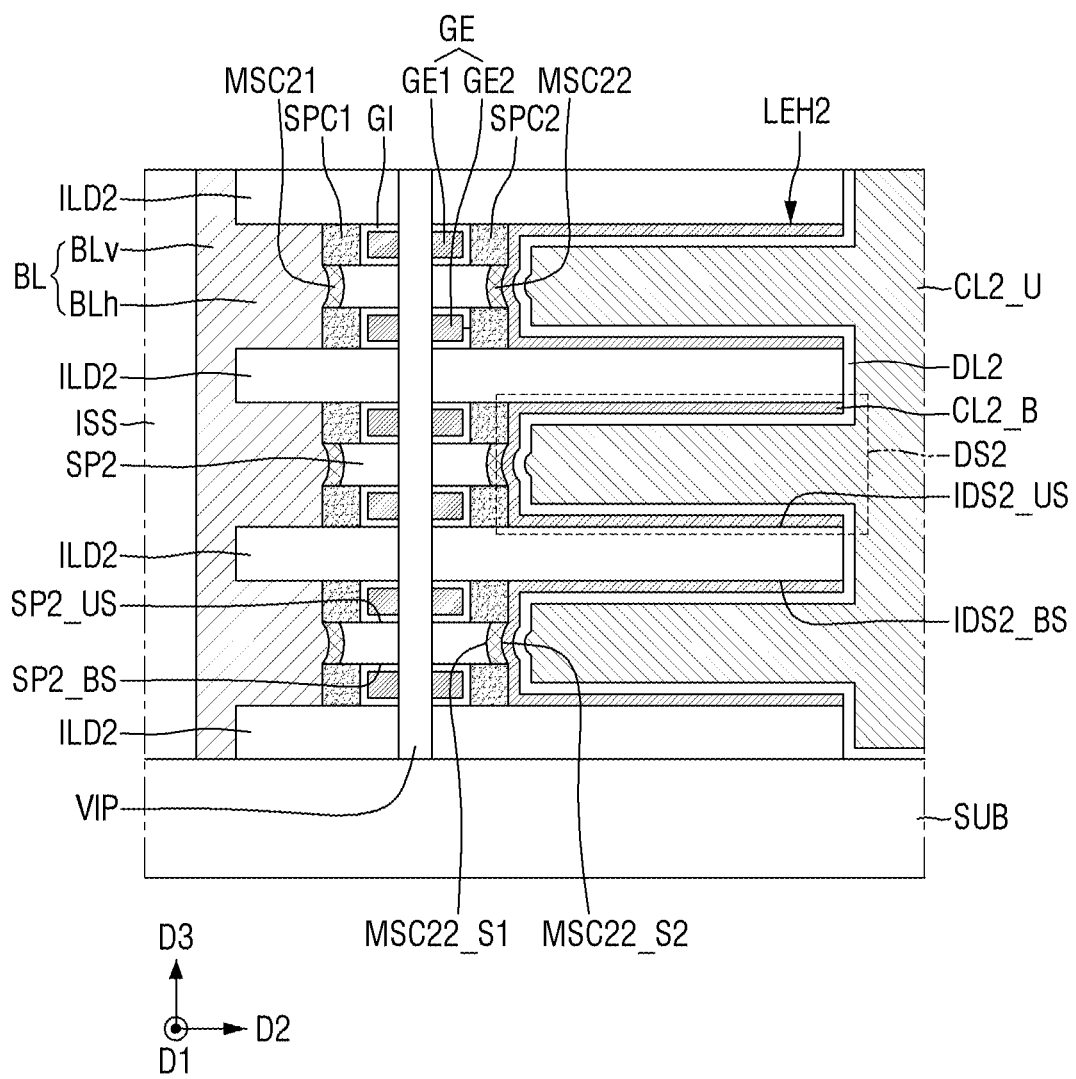
FIG. 26 is a diagram for explaining a semiconductor device according to some embodiments.

FIG. 26 is a diagram for explaining a semiconductor device according to some embodiments. For convenience of explanation, differences from contents explained using FIG. 24 will be mainly explained.

For reference, FIG. 26 is a simplified example cross-sectional view in which the portion of the second semiconductor patterns SP2 stacked in the third direction D3 in FIG. 18 is taken along the second direction D2.

Referring to FIG. 26, the semiconductor device according to some embodiments may include a vertical insulation pattern VIP that penetrates the second semiconductor pattern SP2. Though the second semiconductor patterns SP2 are illustrated as in the same cross-sectional plane as the vertical insulation pattern VIP, this is for ease of reference, and the embodiments are not limited thereto. For example, in a cross-section of the sub-cell arrays SCA of FIG. 18 including the vertical insulation pattern VIP the second semiconductor patterns SP2 may and/or may not be visible.

Each second semiconductor pattern SP2 may be placed along the periphery of the vertical insulation pattern VIP.

Figure 27:
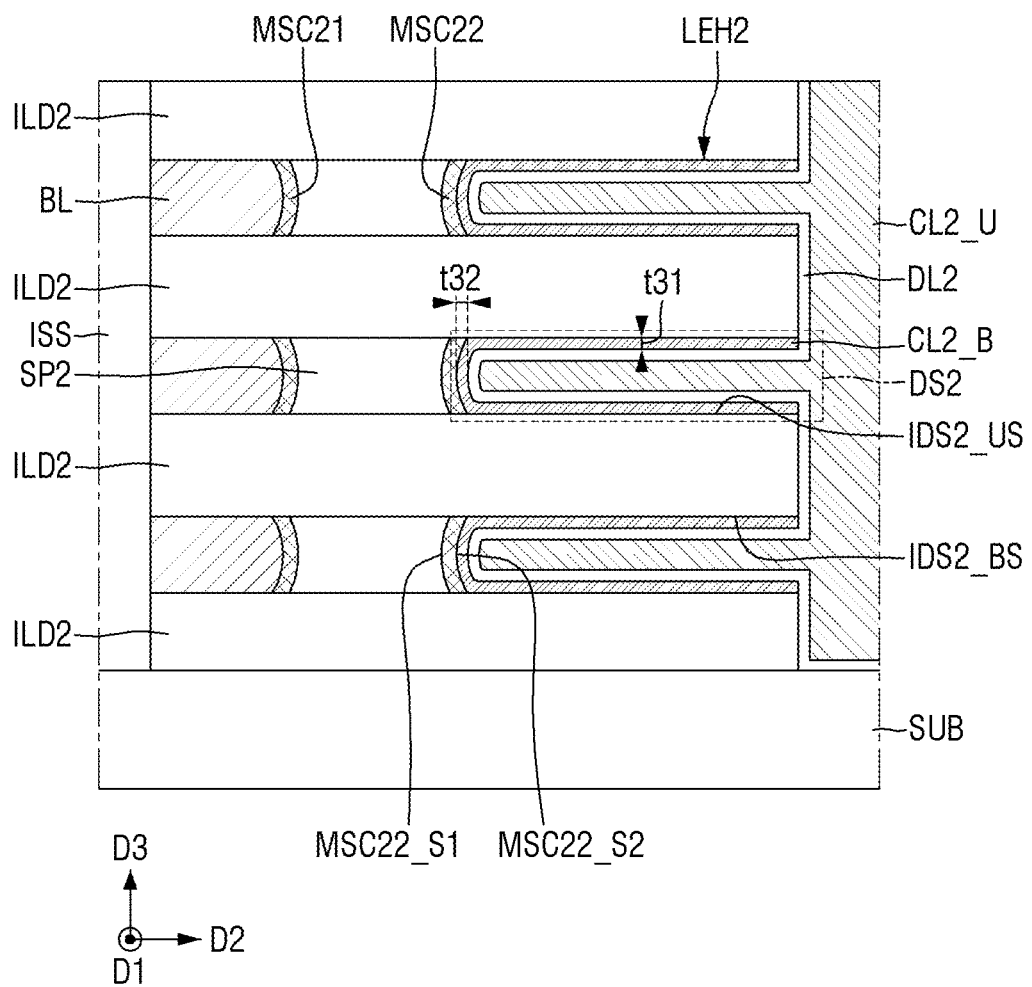
FIG. 27 is a diagram for explaining a semiconductor device according to some embodiments.

FIG. 27 is a diagram for explaining a semiconductor device according to some embodiments. For convenience of explanation, differences from contents explained using FIG. 24 will be mainly explained.

For reference, FIG. 27 may be an example cross-sectional view in which a portion of the second semiconductor patterns SP2 stacked in the third direction D3 in FIG. 20 or 21 is taken along the second direction D2.

Referring to FIGS. 20, 21 and 27, in the semiconductor device according to some embodiments, the plurality of gate electrodes GE is not placed between the second mold insulating layers ILD2 adjacent to each other in the third direction D3.

The sidewalls of the each second side extension hole LEH2 may be defined by the second sidewall MSC22_S2 of the second_2 silicide pattern.

Each second semiconductor pattern SP2 spaced apart from each other in the third direction D3 is connected to the bit lines BL different from each other. Each bit line BL may extend in the first direction D1.

FIGS. 28 to 29 and 32 to 33 are intermediate stage diagrams for explaining a method for fabricating the semiconductor device according to some embodiments. FIGS. 30 and 31 are flowcharts for explaining a method for fabricating the semiconductor device according to some embodiments.

Figure 28:
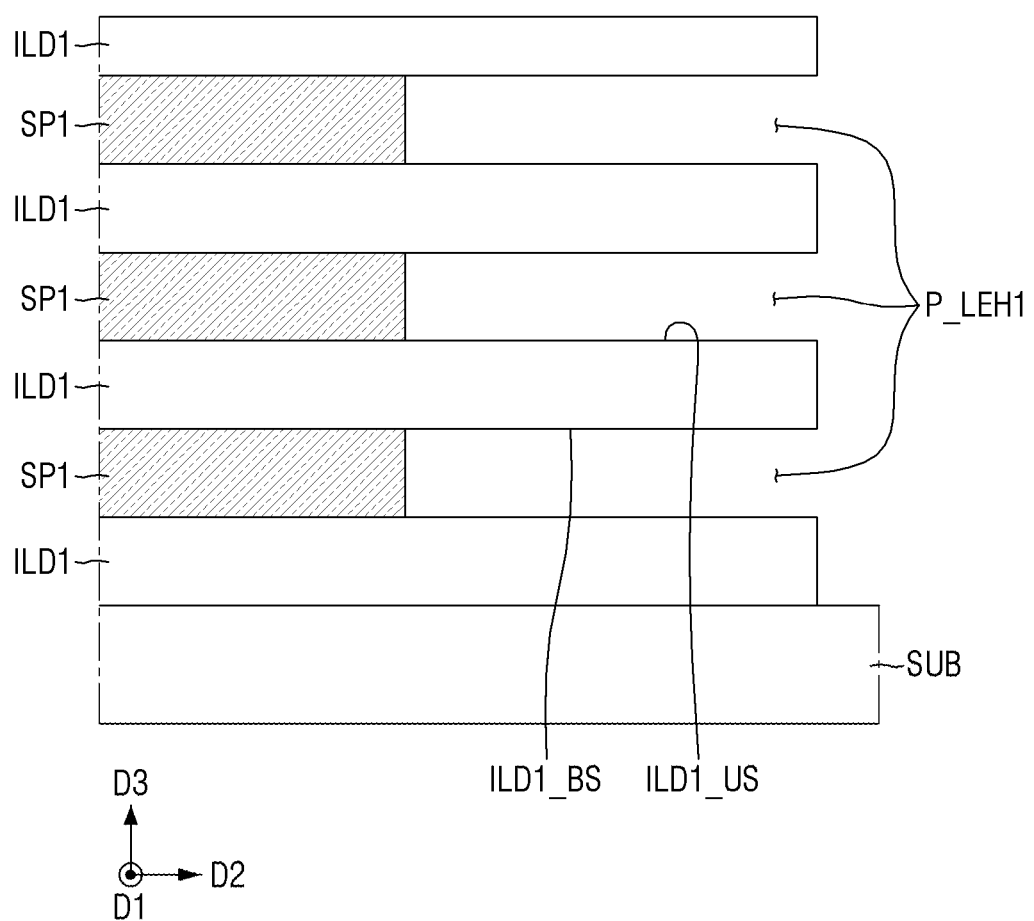
FIGS. 28 to 29 and 32 to 33 are intermediate stage diagrams for explaining a method for fabricating the semiconductor device according to some embodiments.

Referring to FIG. 28, a mold structure may be formed on the substrate SUB. The mold structure includes a first mold insulating layer ILD1 and a first semiconductor pattern SP1 that are alternately stacked in the third direction D3.

The mold structure includes a first semiconductor pattern SP1, and a plurality of pre side extension holes P_LEH1 defined by adjacent first mold insulating layers ILD1 and a sidewall of the first semiconductor pattern SP1.

The pre side extension holes P_LEH1 extend, for example, in the second direction D2.

Figure 29:
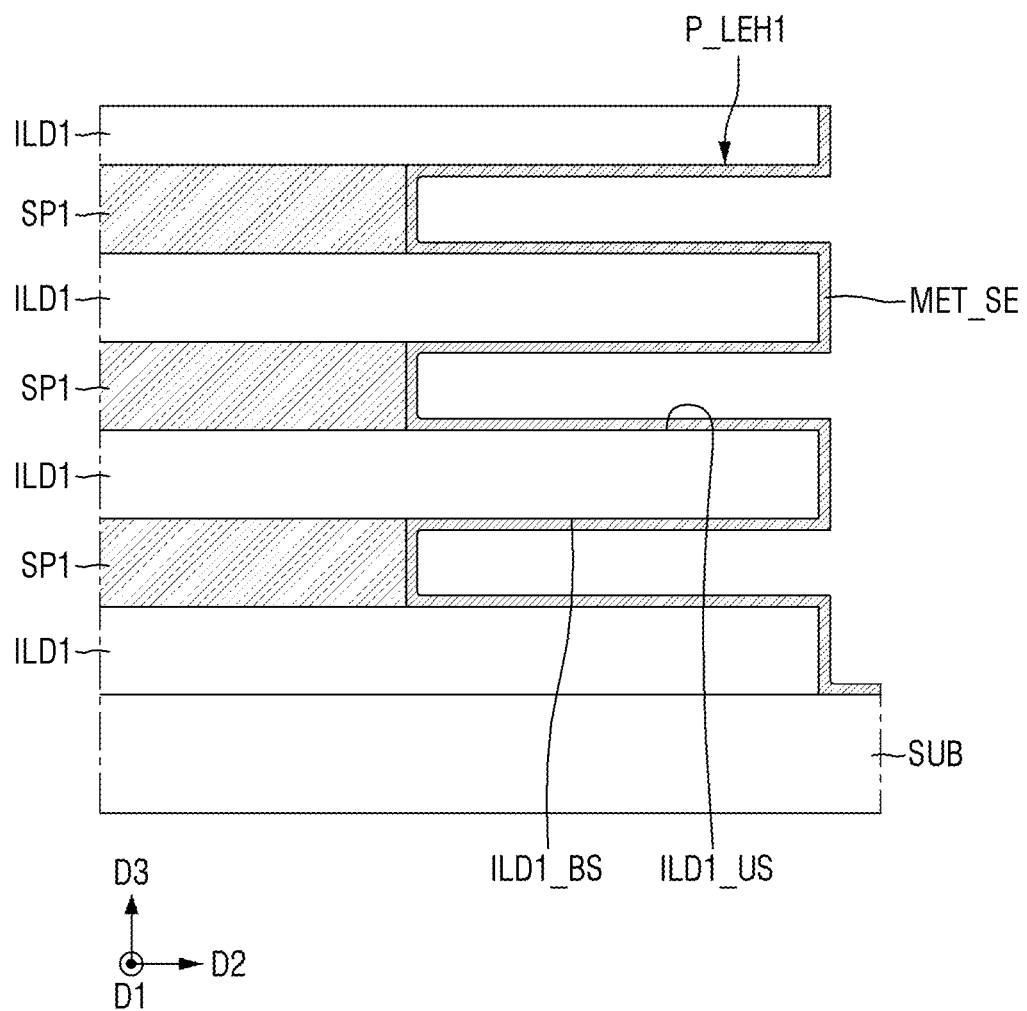

Referring to FIGS. 29 to 31, a seed metal film MET_SE may be formed along the profile of each pre side extension hole P_LEH1. For example, the pre seed metal film (not illustrated) may be formed by supplying a metal precursor to the mold structure.

The seed metal film MET_SE may be formed, using a reductant having group IVA element and/or group IVB element as a central atom. For example, the reductant may have group IVA element or group IVB element as the central atom. In some embodiments the central atom may be at least one of germanium (Ge), tin (Sn), lead (Pb), titanium (Ti), zirconium (Zr), hafnium (Hf), and/or rutherfordium (Rf). In some embodiments, the reductant may include at least one of titanium (Ti), niobium (Nb), molybdenum (Mo), tungsten (W), and/or cobalt (Co).

As an example, the seed metal film MET_SE may be formed using an atomic layer deposition (ALD) and/or a chemical vapor deposition (CVD) method.

For example, referring to FIG. 30, a metal precursor, which includes a metal included in the seed metal film MET_SE and a reactor bonded to the metal may be provided. The metal precursor may be adsorbed along the profile of the pre side extension hole P_LEH1. For example, the metal precursor may be adsorbed on the surface of the exposed first semiconductor pattern SP1 and the surface of the exposed first mold insulating layer ILD1.

Subsequently, the metal precursor that is not adsorbed on the surface of the first semiconductor pattern SP1 and the surface of the first mold insulating layer ILD1 may be removed through a purging process. For example, a non-reactive gas may be introduced to purge the metal precursor that is not adsorbed.

Subsequently, a reductant, having group IVA or group IVB element as a central atom, may be provided. The metal of the metal precursor and the reactor bonded to the metal may be separated through a reaction between the reductant and the metal precursor. Accordingly, the metal included in the metal precursor may be adsorbed on the surface of the exposed first semiconductor pattern SP1 and the surface of the exposed first mold insulating layer ILD1.

Subsequently, the by-products produced through the reaction between the reductant and the metal precursor may be removed through a purging process.

The above-mentioned metal adsorption process may be repeated M times to form a seed metal film MET_SE. Here, M may be a natural number greater than 2.

Subsequently, a nitrogen source may be provided to prevent oxidation of the seed metal film MET_SE. A metal nitride film may be formed on the surface of the seed metal film MET_SE, due to a reaction between the seed metal film MET_SE and the provided nitrogen source. For example, the nitrogen source may be used for a surface nitriding treatment of the seed metal film MET_SE.

Subsequently, a remainder of the nitrogen source, which is not used in the surface nitriding treatment, may be removed through a purging process.

The surface nitriding process explained above may be performed N times. Here, N may be a natural number greater than or equal to 1.

However, the embodiments are not limited thereto, and unlike that mentioned above, in some embodiments, the surface nitriding process may be omitted.

In another embodiment, as depicted in FIG. 31, a metal precursor including a metal included in the seed metal film MET_SE and a reductant may be provided at the same time. A seed metal film MET_SE may be formed on the surface of the exposed first semiconductor pattern SP1 and the surface of the exposed first mold insulating layer ILD1 through the reaction between the reductant and the metal precursor.

Subsequently, the metal precursor, the reductant, and the reaction by-products that are not involved in the reaction may be removed through the purging process.

Subsequently, the nitrogen source may be provided to prevent oxidation of the seed metal film MET_SE.

Subsequently, the nitrogen source, which is not used in the surface nitriding treatment, may be removed through a purging process.

As an example, the aforementioned process may be repeated. As another example, the aforementioned process may terminate at a time.

Unlike that mentioned above, the metal of the metal precursor may be separated from the reactor of the metal precursor, using plasma. However, when the first mold insulating layer ILD1 and the first semiconductor pattern SP1 alternately stacked are formed to be high on the substrate SUB, the concentration of plasma may sharply change as it goes away from the substrate SUB. For example, the plasma concentration may decrease sharply toward the substrate SUB. In such cases, an amount of the metal precursor, which was decomposed by the plasma, decreased with proximity to the substrate SUB. In some embodiments, the amount of metal precursor decomposed by the plasma may be proportional to the thickness of the seed metal film MET_SE. For example, the thickness of the seed metal film MET_SE at a point distant from the substrate SUB may be twice as thick as the thickness of the seed metal film MET_SE on the first semiconductor pattern SP1 at a point closer to the substrate SUB. In some embodiments, the seed metal film MET_SE on the first semiconductor pattern SP1 may not be formed at a point close to the substrate SUB. Due to such a thickness deviation of the seed metal film MET_SE, the width deviation of the silicide pattern formed on the first semiconductor pattern SP1 in the second direction D2 also deepens. This will affect the performance and reliability of the semiconductor device.

Figure 32:
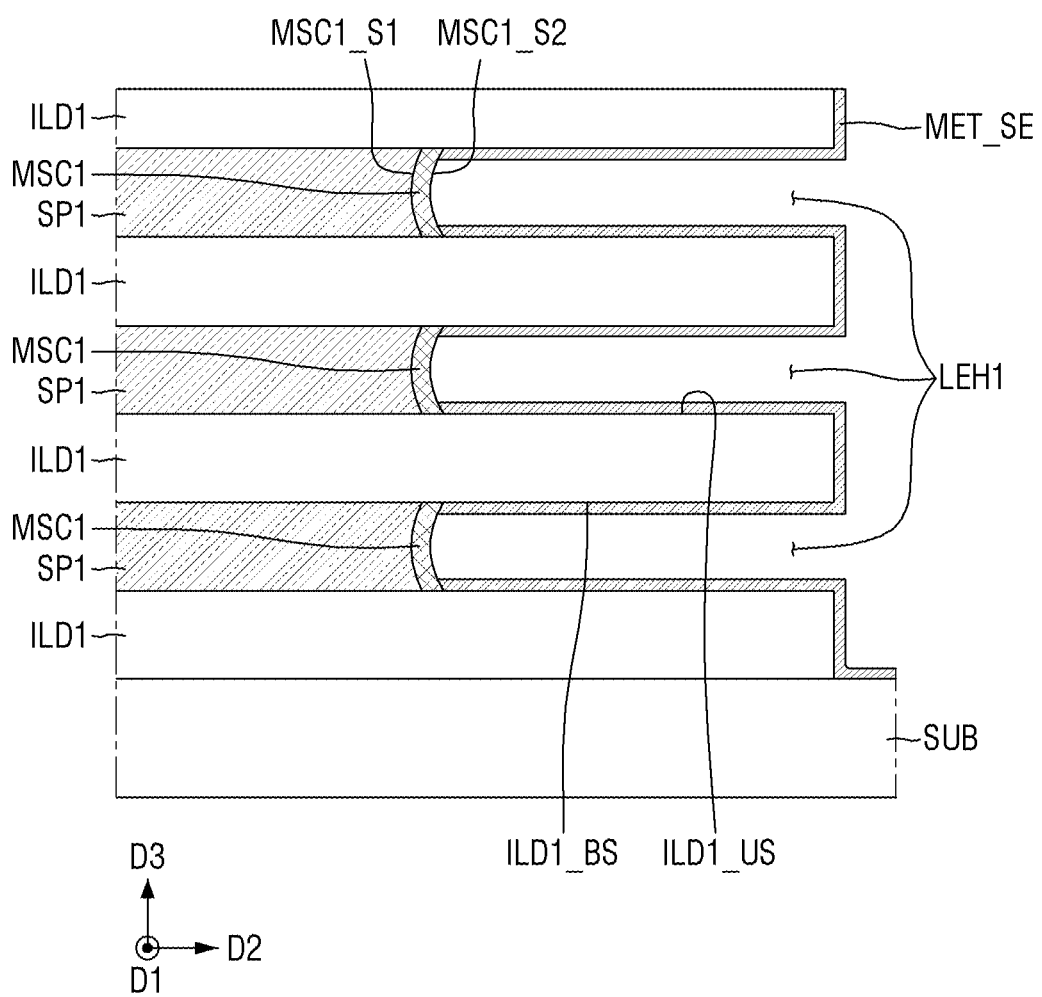

Referring to FIG. 32, a plurality of first silicide patterns MSC1 is formed between the first mold insulating layers ILD1 adjacent to each other in the third direction D3 through the silicidation process of the seed metal film MET_SE and the first semiconductor pattern SP1. For example, the plurality of first silicide patterns MSC1 may be formed by a reaction between the seed metal film MET_SE and the first semiconductor pattern SP1. In some examples, the silicidation process may include heating the seed metal film MET_SE and the first semiconductor pattern SP1. For example, annealing the seed metal film MET_SE and the first semiconductor pattern SP1 may promote the diffusion of atoms between the seed metal film MET_SE and the first semiconductor pattern SP1 at an interface between the seed metal film MET_SE and the first semiconductor pattern SP1.

As a result, the first silicide pattern MSC1 contacts the first semiconductor pattern SP1. Since the first silicide pattern MSC1 is formed only on the first semiconductor pattern SP1, the seed metal film MET_SE remains on the upper face ILD1_US of the first mold insulating layer and the lower face ILD1_BS of the first mold insulating layer.

The first silicide pattern MSC1 includes a first sidewall MSC1_S1 and a second sidewall MSC_S2, which are curved surfaces. By forming the first silicide pattern MSC1, the first side extension hole LEH1 may be defined.

Unlike the shown case, the seed metal film MET_SE may, in some embodiments, remain along the second sidewall MSC1_S2 of the first silicide pattern.

Figure 33:
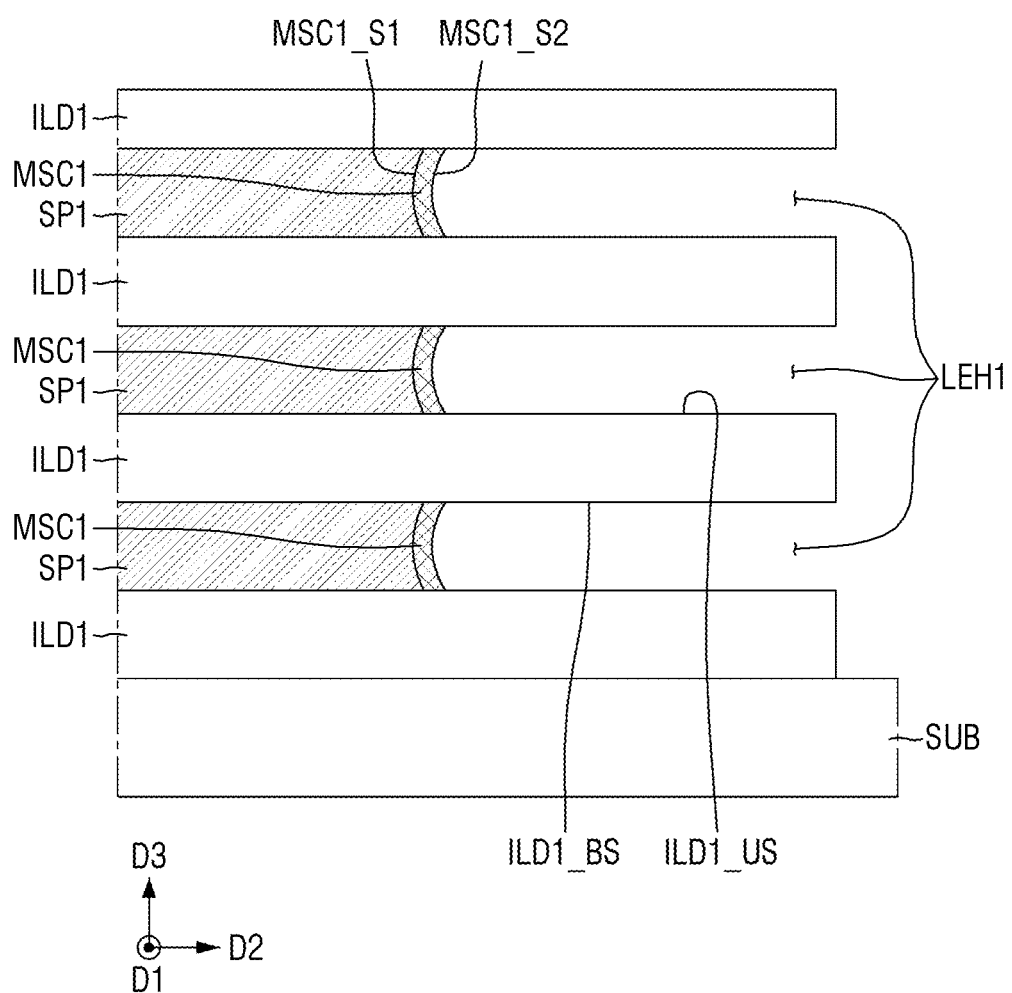

Referring to FIG. 33, the seed metal film MET_SE remaining after the silicidation process may be removed. However, the embodiments are not limited thereto.

For example, unlike the shown case, at least a part of the seed metal film MET_SE remaining after the silicidation process may not be removed. An unremoved part of the seed metal film MET_SE may be included in the first lower metal film CL1_B, the first conductive film CL1 and the first barrier conductive film CL1_BM explained using FIGS. 1 to 13.

Subsequently, one of the first lower metal film CL1_B, the first conductive film CL1, and the first barrier conductive film CL1_BM may be formed in the first side extension hole LEH1. One of the first lower metal film CL1_B, the first conductive film CL1 and the first barrier conductive film CL1_BM may be connected to the first silicide pattern MSC1.

Figure 34:
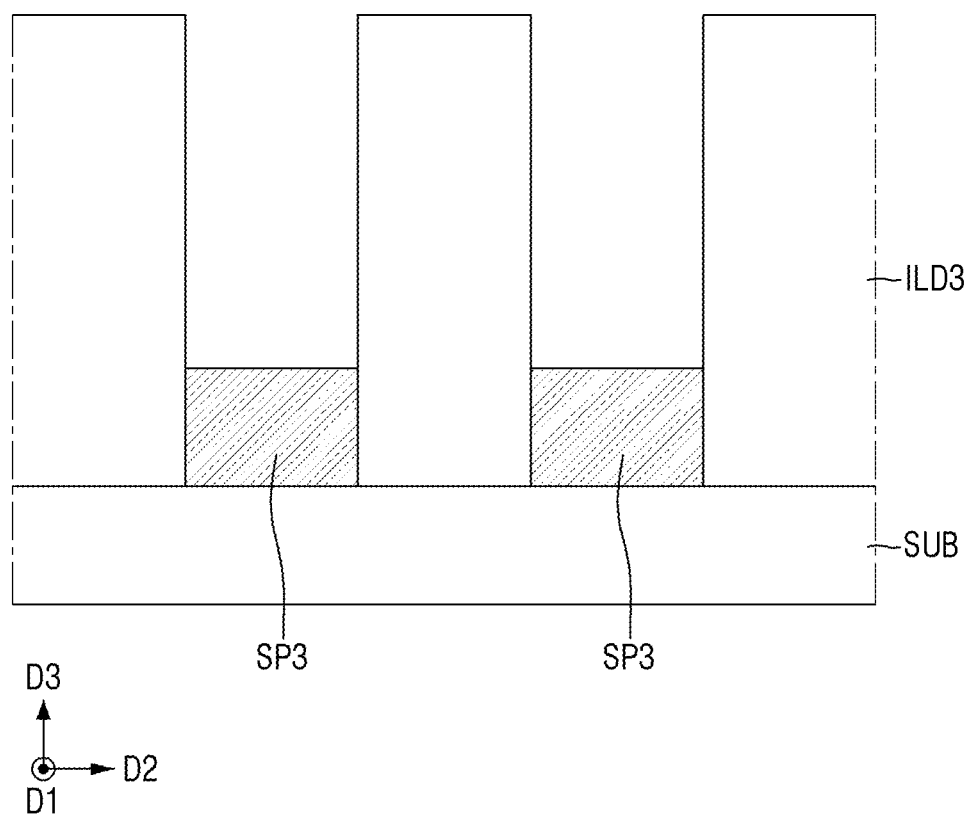
FIG. 34 is an intermediate stage diagram for explaining the method for fabricating a semiconductor device according to some embodiments.

FIG. 34 is an intermediate stage diagram for explaining a method for fabricating a semiconductor device according to some embodiments.

Referring to FIG. 34, a plurality of third mold insulating layers ILD3 spaced apart in the second direction D2 may be placed on the substrate SUB. Each third mold insulating layer ILD3 may extend in the third direction D3.

The third mold insulating layer ILD3 includes an insulating material.

A third semiconductor pattern SP3 may be placed between the adjacent third mold insulating layers ILD3. The third semiconductor pattern SP3 may include, for example silicon and/or silicon-germanium.

In some embodiments, unlike the shown case, a part of the upper face of the substrate SUB may be exposed between the adjacent third mold insulating layers ILD3. The upper face of the exposed substrate SUB may include silicon and/or silicon-germanium.

Subsequently, a seed metal film (MET_SE of FIG. 29) may be formed through the method explained using FIGS. 30 and 31. Subsequently, the silicidation process may proceed.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor device comprising:
    a plurality of semiconductor patterns spaced apart in a first direction;
    a plurality of mold insulating layers between the plurality of semiconductor patterns;
    a plurality of silicide patterns contacting the plurality of semiconductor patterns; and
    a plurality of first metal conductive films between the plurality of mold insulating layers and contacting to the plurality of silicide patterns,
    wherein each of the silicide patterns includes a first sidewall facing a semiconductor pattern of the plurality of semiconductor patterns, and a second sidewall facing a first metal conductive film of the plurality of first metal conductive films,
    the first sidewall of the silicide pattern and the second sidewall of the silicide pattern extends in the first direction, and
    the first sidewall of the silicide pattern and the second sidewall of the silicide pattern are curved surfaces.

2. The semiconductor device of claim 1, wherein each of the curved surfaces are convex toward a semiconductor pattern of the plurality of semiconductor patterns.

3. The semiconductor device of claim 1, wherein
    a width of each of the silicide patterns in a second direction is constant, and
    the second direction is perpendicular to the first direction.

4. The semiconductor device of claim 1, wherein
    a width of each of the silicide patterns, in a second direction, increases and then decreases, and
    the second direction is perpendicular to the first direction.

5. The semiconductor device of claim 1, wherein each of the mold insulating layers includes an upper face and a lower face which are opposite to each other in the first direction, and
    each of the silicide patterns does not extend along the upper face of the mold insulating layer and the lower face of the mold insulating layer.

6. The semiconductor device of claim 1, further comprising:
    a capacitor dielectric film on the first metal conductive films; and
    a second metal conductive film on the capacitor dielectric film.

7. The semiconductor device of claim 6, further comprising:
    a gate electrode on each of the semiconductor patterns.

8. The semiconductor device of claim 7, wherein
    the gate electrode includes a first sub-gate electrode and a second sub-gate electrode, and
    a semiconductor pattern, of the plurality of semiconductor patterns, is between the first sub-gate electrode and the second sub-gate electrode.

9. The semiconductor device of claim 1, wherein each of the first metal conductive films entirely fills a space between adjacent mold insulating layers, of the plurality of mold insulating layers.

10. The semiconductor device of claim 9, wherein
    each of the mold insulating layers includes an upper face and a lower face which are opposite to each other in the first direction, and
    each of the first metal conductive films includes a barrier conductive film that extends along an upper face of the mold insulating layer, a second sidewall of the silicide pattern and a lower face of the mold insulating layer, and a filling conductive film that fills a filling recess defined by the barrier conductive film.

11. A semiconductor device comprising:
    a plurality of semiconductor patterns spaced apart in a first direction;
    a plurality of mold insulating layers between the plurality of semiconductor patterns;
    a plurality of silicide patterns contacting the plurality of semiconductor patterns;
    a plurality of side extension holes defined by the plurality of silicide patterns and adjacent mold insulating layers, of the plurality of mold insulating layers that are adjacent to each other in the first direction, the plurality of side extension holes extending in a second direction perpendicular to the first direction; and
    a plurality of first metal conductive films in the plurality of side extension holes, the plurality of first metal conductive films connected to the plurality of silicide patterns,
    wherein each of the silicide patterns includes a first sidewall facing a semiconductor pattern of the plurality of semiconductor patterns, and a second sidewall facing a first metal conductive film of the plurality of first metal conductive films,
    each of the side extension hole includes an upper face and a lower face defined by the adjacent mold insulating layers, and a sidewall defined by the second sidewall of the silicide pattern,
    in each of the side extension holes on the side surface, a ratio of a width of the side extension hole in the second direction to a height of the side extension hole in the first direction is 5 or more, and
    widths of each of the silicide patterns in the second direction are the same at corresponding heights.

12. The semiconductor device of claim 11, wherein widths of each of the silicide patterns in the second direction are constant.

13. The semiconductor device of claim 11, wherein widths of each of the silicide patterns, in the second direction, increase and then decrease based on a distance from the lower face of the side extension holes.

14. The semiconductor device of claim 11, further comprising:

a capacitor dielectric film on the first metal conductive films; and a second metal conductive film on the capacitor dielectric film, wherein the plurality of first metal conductive films extend along the upper faces, the lower faces, and the sidewalls of the plurality of side extension holes.

15. The semiconductor device of claim 11, wherein the plurality of first metal conductive films entirely fills the plurality of side extension hole.

16. A semiconductor device comprising:
a plurality of mold insulating layers spaced apart in a first direction;
a plurality of semiconductor patterns between the plurality of mold insulating layers;
a plurality of gate electrodes on the plurality of semiconductor patterns, the plurality of gate electrodes extending in a second direction perpendicular to the first direction;
a bit line extending in the first direction and connected to the plurality of semiconductor patterns;
a plurality of silicide patterns contacting the plurality of semiconductor patterns;
a plurality of side extension holes defined by the plurality of silicide patterns and adjacent mold insulating layers of the plurality of mold insulating layers, the plurality of side extension holes extending in a third direction perpendicular to the first direction and the second direction; and
a plurality of capacitors in the plurality of side extension holes and connected to the plurality of silicide patterns,
wherein each side extension hole includes an upper face and a lower face defined by the adjacent mold insulating layers and a sidewall defined by a silicide pattern of the plurality of silicide patterns, each of the silicide patterns does not extend along the upper face of the side extension hole and the lower face of the side extension hole, and widths of each of the silicide patterns in the third direction are the same at points of corresponding heights.

17. The semiconductor device of claim 16, wherein
each of the silicide patterns includes a first sidewall facing the semiconductor pattern, and a second sidewall facing the capacitor, and
each of the first sidewall of the silicide pattern and the second sidewall of the silicide pattern are curved surfaces that are convex toward the semiconductor pattern.

18. The semiconductor device of claim 16, wherein each of the gate electrodes includes an upper gate electrode on an upper face of the semiconductor pattern, and a lower gate electrode on a lower face of the semiconductor pattern.

19. The semiconductor device of claim 16, wherein
each of the capacitors includes a lower electrode extending along a profile of the side extension hole, a capacitor dielectric film on the lower electrode, and an upper electrode on the capacitor dielectric film, and
a thickness of the lower electrode on the upper face of the side extension hole is the same as a thickness of the lower electrode on the sidewall of the side extension hole.

20. The semiconductor device of claim 16, wherein
each of the capacitors includes a lower electrode extending along a profile of the side extension hole, a capacitor dielectric film on the lower electrode, and an upper electrode on the capacitor dielectric film, and
a thickness of the lower electrode on the upper face of the side extension hole is thicker than a thickness of the lower electrode on the sidewall of the side extension hole.

* * * * *